United States Patent
Kim et al.

(10) Patent No.: US 9,806,144 B2
(45) Date of Patent: Oct. 31, 2017

(54) SOLENOID INDUCTOR IN A SUBSTRATE

(71) Applicant: QUALCOMM Incorporated, San Diego, CA (US)

(72) Inventors: Daeik Daniel Kim, San Diego, CA (US); Young Kyu Song, San Diego, CA (US); Xiaonan Zhang, San Diego, CA (US); Jonghae Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/079,488

(22) Filed: Nov. 13, 2013

(65) Prior Publication Data

US 2015/0130021 A1    May 14, 2015

(51) Int. Cl.
*H01L 49/02*    (2006.01)
*H01F 17/00*    (2006.01)
*H01F 41/04*    (2006.01)

(52) U.S. Cl.
CPC ......... *H01L 28/10* (2013.01); *H01F 17/0013* (2013.01); *H01F 41/041* (2013.01); *H01F 2017/0053* (2013.01)

(58) Field of Classification Search
CPC . H01L 23/5227; H01L 28/10; H01L 27/0288; H01L 2924/1206; H01L 2924/19042
USPC ........................................................ 257/531
See application file for complete search history.

(56) References Cited

U.S. PATENT DOCUMENTS

| 7,791,167 | B1 | 9/2010 | Rofougaran |
| 8,079,134 | B2 | 12/2011 | Maki et al. |
| 8,471,358 | B2 | 6/2013 | Yen et al. |
| 2007/0267718 | A1* | 11/2007 | Lee ..................... H01F 17/0013 257/531 |

(Continued)

FOREIGN PATENT DOCUMENTS

| CN | 102270532 A | 12/2011 |
| CN | 103050483 A | 4/2013 |

(Continued)

OTHER PUBLICATIONS

International Search Report and Written Opinion—PCT/US2014/064299—ISA/EPO—Feb. 11, 2015.

*Primary Examiner* — Michael Jung
*Assistant Examiner* — Mikka Liu
(74) *Attorney, Agent, or Firm* — Loza & Loza, LLP/Qualcomm

(57) ABSTRACT

Some implementations provide an integrated device (e.g., semiconductor device) that includes a substrate and an inductor in the substrate. In some implementations, the inductor is a solenoid inductor. The inductor includes a set of windings. The set of windings has an inner perimeter. The set of windings includes a set of interconnects and a set of vias. The set of interconnects and the set of vias are located outside the inner perimeter of the set of windings. In some implementations, the set of windings further includes a set of capture pads. The set of interconnects is coupled to the set of vias through the set of capture pads. In some implementations, the set of windings has an outer perimeter. The set of pads is coupled to the set of interconnects such that the set of pads is at least partially outside the outer perimeter of the set of windings.

24 Claims, 20 Drawing Sheets

(56) References Cited

U.S. PATENT DOCUMENTS

| | | |
|---|---|---|
| 2009/0322446 A1 | 12/2009 | Daley et al. |
| 2010/0019300 A1 | 1/2010 | Yu et al. |
| 2011/0291232 A1* | 12/2011 | Yen et al. .................... 257/531 |
| 2013/0093045 A1* | 4/2013 | Cho .................. H01L 23/5223 |
| | | 257/531 |
| 2013/0200968 A1 | 8/2013 | Singh et al. |
| 2013/0335186 A1* | 12/2013 | Chang .................... H01F 5/003 |
| | | 336/200 |
| 2014/0027880 A1* | 1/2014 | Duevel .............. H01F 17/0006 |
| | | 257/531 |

FOREIGN PATENT DOCUMENTS

| | | |
|---|---|---|
| CN | 103377795 A | 10/2013 |
| TW | 201340136 A | 10/2013 |

\* cited by examiner

SOLENOID INDUCTOR IN A SUBSTRATE

BACKGROUND

Field

Various features relate to a solenoid inductor in a substrate.

Background

Planar inductors are made with a spiral and an overpass. Multiple turns are necessary to achieve inductance. However, multiple turns increases the area that the planar inductor occupies. FIG. 1 illustrates an example of a planar inductor 100. A shown in FIG. 1, the planar inductor 100 includes a set of windings 102, a first port 104, a via 106, and a second port 108. The planar inductor 100 is a planar inductor in a substrate. The set of windings 102 is a set of spiral interconnects that form 3.5 turns. The set of spiral interconnects is a metal layer on a substrate. The first port 104 is coupled to a first end of the set of windings 102. The via 106 is coupled to a second end of the set of windings 102. The second port 108 is coupled to the via 106. In some implementations, the second port 108 is a second metal layer (e.g., overpass layer).

The set of windings 102 have inners turns (e.g., 3.5 turns) that can cause eddy current loss to the outer turns. Such eddy current loss can reduce the quality factor (Q) of the inductor. As shown in FIG. 1, the via 106 is a large via, which adds a big and thick metallization in the middle of the inductor 100. The via 106 also degrades the quality factor of the inductor 100.

Therefore, there is a need for an improved inductor design for semiconductor devices. Ideally, such an inductor will have better inductance performance, lower resistance and better quality factor value, of the semiconductor device.

SUMMARY

Various features, apparatus and methods described herein provide a solenoid inductor in a substrate.

A first example provides an integrated device that includes a substrate and an inductor in the substrate. The inductor includes a set of windings. The set of windings comprises an inner perimeter. The set of windings includes a set of interconnects and a set of vias. The set of interconnects and the set of vias are located outside the inner perimeter of the set of windings.

According to an aspect, the set of windings further includes a set of capture pads. The set of interconnects is coupled to the set of vias through the set of capture pads.

According to one aspect, the set of windings includes an outer perimeter. The set of pads is coupled to the set of interconnects such that the set of pads is at least partially outside the outer perimeter of the set of windings.

According to an aspect, the set of windings includes an outer perimeter, the set of pads is coupled to the set of interconnects such that the set of capture pads protrudes away from an inner portion of the inductor and the set of windings.

According to one aspect, the set of interconnects includes a first interconnect and a second interconnect, the set of vias includes a first via and a second via, and the set of pads includes a first pad and a second pad. In some implementations, the first interconnect is coupled to the first via through the first pad, the first via is coupled to the second interconnect through a second pad.

According to an aspect, the inductor is a solenoid inductor.

According to one aspect, the substrate includes one of at least a dielectric, glass, ceramic, and/or silicon.

According to an aspect, the set of windings has a non-circular winding.

According to one aspect, the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A second example provides a substrate and an inductive means in the substrate. The inductive means includes a first means for providing an electrical lateral path along a lateral direction in the substrate. The electrical lateral path being about a first perimeter. The inductive means further includes a second means for providing an electrical vertical path along a vertical direction in the substrate. The electrical vertical path being outside of the first perimeter.

According to an aspect, the first perimeter is an inner perimeter of the first means.

According to one aspect, the electrical lateral path is about a second perimeter. The electrical vertical path is at least partially outside the second perimeter.

According to an aspect, the second means protrudes away from an inner portion of the inductive means, and the first means.

According to one aspect, the first means includes a first interconnect and a second interconnect, the second means includes a first via, a second via, a first capture pad, and a second capture pad.

According to an aspect, the first perimeter is a first circumference.

According to one aspect, the inductive means is a solenoid inductor.

According to an aspect, the substrate includes one of at least a dielectric, glass, ceramic, and/or silicon.

According to one aspect, the inductive means has a non-circular winding.

According to an aspect, the apparatus is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A third example provides a method for providing an integrated device. The method provides a substrate. The method provides a set of interconnects in the substrate. The method provides a set of vias in the substrate so that the set of interconnects and the set of vias form a set of windings configured to operate as an inductor in the substrate. The set of windings includes an inner perimeter. The set of interconnects and the set of vias are provided in the substrate so the set of interconnects and the set of vias are located outside the inner perimeter of the set of windings.

According to an aspect, the method further provides a set of capture pads in the substrate. The set of capture pads are provided in the substrate so that the set of interconnects are coupled to the set of vias through the set of capture pads. The set of interconnects, the set of vias, the set of capture pads are provided in the substrate to form the set of windings.

According to one aspect, the set of windings includes an outer perimeter, the set of pads is coupled to the set of interconnects such that the set of capture pads is at least partially outside the outer perimeter of the set of windings.

According to an aspect, the set of windings comprises an outer perimeter, the set of capture pads is coupled to the set of interconnects such that the set of capture pads protrudes away from an inner portion of the inductor and the set of windings.

According to one aspect, the set of interconnects includes a first interconnect and a second interconnect, the set of vias includes a first via and a second via, and the set of pads includes a first pad and a second pad. In some implementations, the first interconnect is coupled to the first via through the first pad, the first via is coupled to the second interconnect through a second pad.

According to an aspect, the inductor is a solenoid inductor.

According to one aspect, the substrate includes one of at least a dielectric, glass, ceramic, and/or silicon.

According to an aspect, the set of windings has a non-circular winding.

According to one aspect, the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

Some novel features pertain to an integrated device (e.g., semiconductor device) that includes a substrate and an inductor in the substrate. In some implementations, the inductor is a solenoid inductor. The inductor includes a set of windings. The set of windings has an inner perimeter (e.g., an inner circumference). The set of windings includes a set of interconnects and a set of vias. The set of interconnects and the set of vias are located outside the inner perimeter of the set of windings. In some implementations, the set of windings further includes a set of capture pads. The set of interconnects is coupled to the set of vias through the set of capture pads. In some implementations, the set of windings has an outer perimeter (e.g., outer circumference). The set of pads is coupled to the set of interconnects such that the set of pads is at least partially outside the outer perimeter of the set of windings. In some implementations, the set of windings includes an outer perimeter, the set of capture pads is coupled to the set of interconnects such that the set of pads protrudes away from an inner portion of the inductor and the set of windings. In some implementations, the set of interconnects includes a first interconnect and a second interconnect, the set of vias includes a first via and a second via, and the set of pads includes a first capture pad and a second capture pad. In some implementations, the first interconnect is coupled to the first via through the first pad, and the first via is coupled to the second interconnect through a second pad. In some implementations, the substrate includes one of at least a dielectric, glass, ceramic, and/or silicon. In some implementations, the substrate is a packaging substrate.

Exemplary Solenoid Inductor in a Substrate

Figure 1:
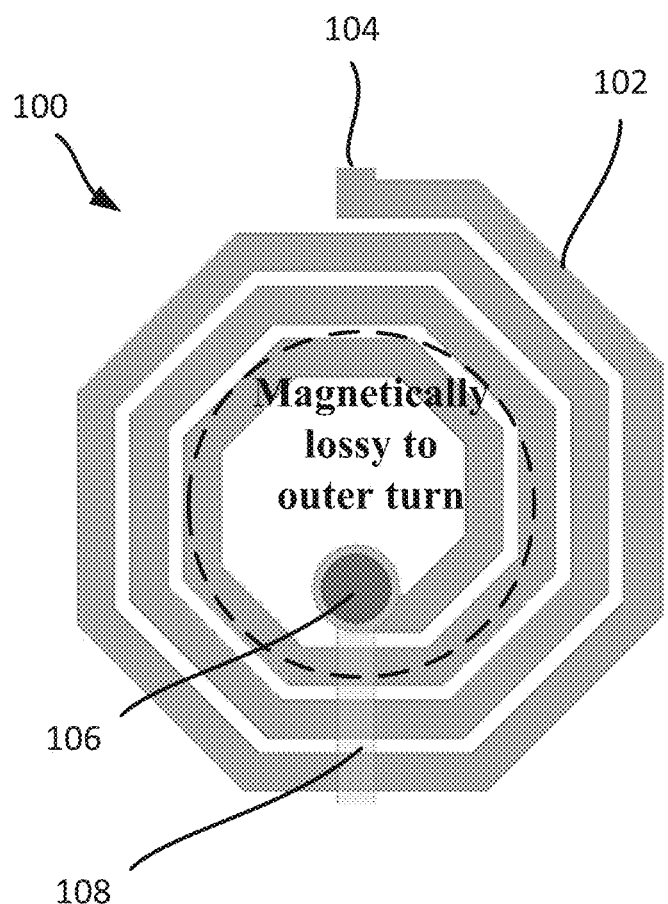
FIG. 1 illustrates a conventional inductor.
Figure 2:
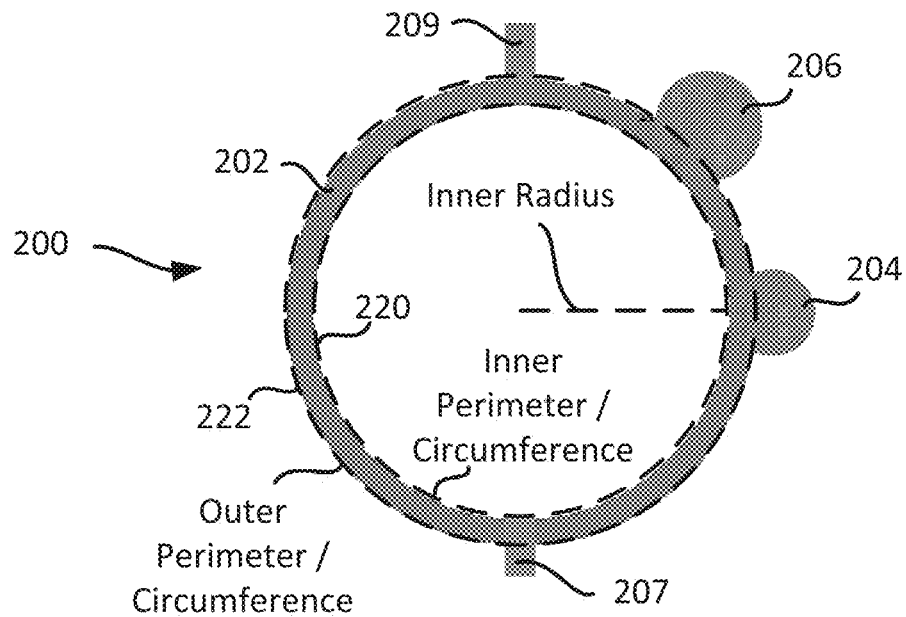
FIG. 2 illustrates a plan view of a novel solenoid inductor.
Figure 3:
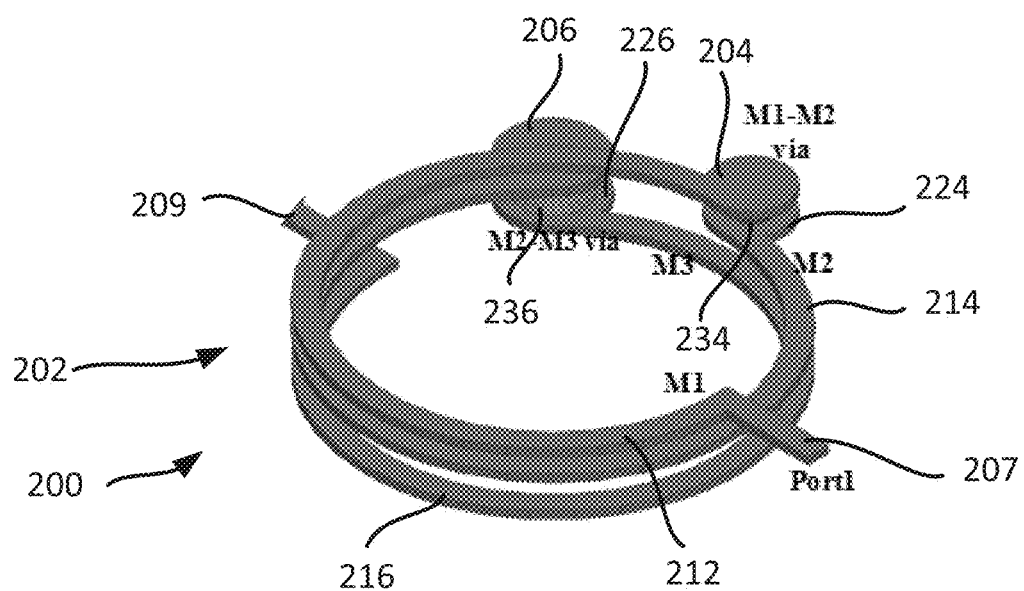
FIG. 3 illustrates an angled view of a novel solenoid inductor.

FIGS. 2-3 conceptually illustrate a novel inductor for a device (e.g., integrated device, semiconductor device). Specifically, FIG. 2 illustrates a top view of an inductor 200 that includes a set of windings 202, a first capture pad 204, a second capture pad 206, a first port 207, and a second port 209. In some implementations, the inductor 200 is a solenoid inductor. In some implementations, the inductor 200 is located in a substrate (e.g., laminated substrate, glass substrate, ceramic substrate, silicon substrate). The set of windings 202 includes spiral interconnects (e.g., metal layers). As show in FIG. 2, the inductor 200 has an inner perimeter 220 (e.g., inner circumference) and an outer perimeter 222 (e.g., outer circumference). In some implementations, the set of windings 202 (e.g., interconnects) has the inner perimeter 220 and the outer perimeter 222. The inner perimeter 220 has an inner radius. As further shown in FIG. 2, none of the components of the inductor 200 are located within the inner perimeter 220. That is, all of the components of the inductor 200 are on or outside the inner perimeter 220. In some implementations, the first pad 204 and the second pad 206 are outside the inner perimeter 220 in order to reduce/minimize eddy current loss. In some implementations, reducing/minimizing the eddy current loss can result in an increase in the quality factor (Q) of the set of windings 202 and/or inductor 200.

FIG. 2 also illustrates that the first capture pad 204 and the second capture pad 206 protrude away from the inner perimeter 220 and the outer perimeter 222. In particular, as shown in FIG. 2, in some implementations, at least a portion (e.g., some or all) of the first pad 204 is outside the outer perimeter 222 of the set of windings 202. Similarly, in some implementations, at least a portion (e.g., some or all) of the second pad 206 is outside the outer perimeter 222 of the set of windings 202. In some implementations, at least a portion of the first pad 204 and at least a portion of the second pad 206 are outside the outer perimeter 222 in order to reduce/minimize eddy current loss. In some implementations, reducing/minimizing the eddy current loss can result in an increase in the quality factor (Q) of the set of windings 202 and/or inductor 200.

FIG. 3 illustrates an angled view of the inductor 200. In some implementations, the inductor 200 is a solenoid inductor. As shown in FIG. 3, the set of windings 202 includes a first metal layer 212, a second metal layer 214, and a third metal layer 216. In some implementations, the first metal layer 212 is a first interconnect in a substrate (e.g., laminated substrate, glass substrate, ceramic substrate, silicon substrate). The substrate may be a packaging substrate. In some implementations, the second metal layer 214 is a second interconnect in the substrate. In some implementations, the third metal layer 216 is a third interconnect in the substrate. The first, second, and third metal layers 212, 214, and 216 define a spiral in a substrate in some implementations. The first metal layer 212 is coupled to the first port 207. The third metal layer 216 is coupled to the second port 209.

FIG. 3 also illustrates that the inductor 200 includes the first capture pad 204, the second capture pad 206, a third capture pad 224, a fourth capture pad 226, a first via 234, and a second via 236. In some implementations, the set of windings 202 includes the first pad 204, the second pad 206, the third pad 224, the fourth pad 226, the first via 234, and the second via 236. In some implementations, the first pad 204 is part of the first metal layer 212. In some implementations, the second pad 206 is part of the second metal layer 214.

As shown in FIG. 3, the first port 207 is coupled to the first metal layer 212. The first metal layer 212 is coupled to the first pad 204. The first pad 204 is coupled to the first via 234. The first via 234 is coupled to the third pad 224. The third pad 224 is coupled to the second metal layer 214. The second metal layer 214 is coupled to the second pad 206. The second pad 206 is coupled to the second via 236. The second via 236 is coupled to the fourth pad 226. The fourth pad 226 is coupled to the third metal layer 216. The third metal layer 216 is coupled to the second port 209. None of the components of the inductor 200 are located within the inner perimeter 220. That is, all of the components of the inductor 200 are on or outside the inner perimeter 220.

In some implementations, the first capture pad 204, the second capture pad 206, the third capture pad 224, and the fourth capture pad 226 are outside the inner perimeter 220 in order to reduce/minimize eddy current loss. In some implementations, reducing/minimizing the eddy current loss can result in an increase in the quality factor (Q) of the set of windings 202 and/or inductor 200.

FIG. 3 also illustrates that the first pad 204, the second pad 206, the third pad 224, and the fourth pad 226 protrude away from the inner perimeter 220 and the outer perimeter 222 (e.g., away from the inner portion of the solenoid inductor). In particular, as shown in FIG. 3, in some implementations, at least a portion (e.g., some or all) of the first pad 204 is outside the outer perimeter 222 of the set of windings 202. Similarly, in some implementations, at least a portion (e.g., some or all) of the second pad 206 is outside the outer perimeter 222 of the set of windings 202. Additionally, in some implementations, at least a portion (e.g., some or all) of the third pad 224 is outside the outer perimeter 222 of the set of windings 202. Moreover, in some implementations, at least a portion (e.g., some or all) of the fourth pad 226 is outside the outer perimeter 222 of the set of windings 202. In some implementations, at least a portion of the first pad 204, at least a portion of the second pad 206, at least a portion of the third pad 224, and at least a portion of the fourth pad 226 are outside the outer perimeter 222 in order to reduce/minimize eddy current loss. In some implementations, reducing/minimizing the eddy current loss can result in an increase in the quality factor (Q) of the set of windings 202 and/or inductor 200.

Although FIGS. 2-3 illustrate an inductor (e.g., solenoid inductor) that includes a circular set of windings, in some implementations, the set of windings may be non-circular (e.g., oval, square, rectangular, hexagonal, octagonal). In instances where non-circular windings are used, these non-circular set of windings may still have an inner perimeter, an outer perimeter, an inner circumference, and an outer circumference. Examples of non-circular windings for an inductor are described in FIGS. 7-8 and 14-15.

In some implementations, for purposes of defining and/or determining the perimeter (e.g., inner perimeter, outer perimeter, inner circumference, outer circumference) of the set of windings, the position and/or dimension of the set pads that are coupled to the set of windings shall not be considered or taken into account (i.e., the set of pads shall be excluded when defining and/or determining the perimeter (e.g., inner perimeter, outer perimeter, inner circumference, outer circumference) of the set of windings). Similarly, in some implementations, for purposes of defining and/or determining the perimeter (e.g., inner perimeter, outer perimeter, inner circumference, outer circumference) of the set of windings, the position and/or dimension of the set vias that are coupled to the set of windings shall not be considered or taken into account (i.e., the set of vias shall be excluded when defining and/or determining the perimeter of the set of windings). For example, in some implementations, only the set of interconnects shall be taken into account when defining and/or determining the perimeter (e.g., inner perimeter, outer perimeter, inner circumference, outer circumference) of the set of windings.

Figure 4:
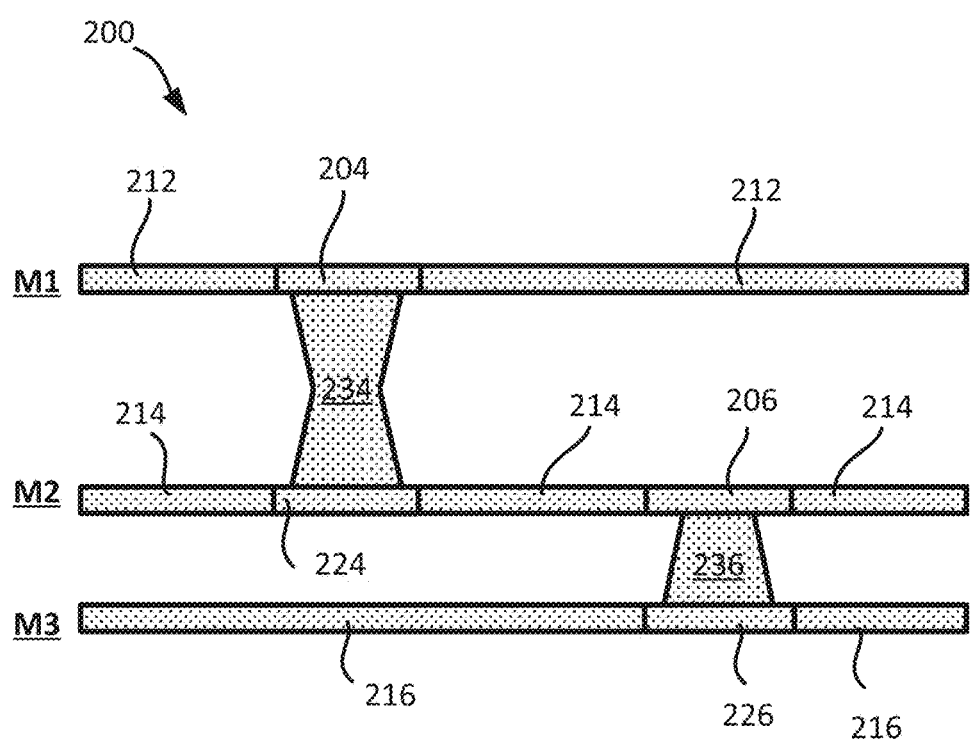
FIG. 4 illustrates a profile view of a novel solenoid inductor.

FIG. 4 illustrates a side view of the inductor 200. In some implementations, the inductor 200 is a solenoid inductor. As shown in FIG. 4, the set of windings 202 includes a first metal layer 212, a second metal layer 214, and a third metal layer 216. In some implementations, the first metal layer 212 is a first interconnect in a substrate (substrate is not shown). In some implementations, the second metal layer 214 is a second interconnect in the substrate. In some implementations, the third metal layer 216 is a third interconnect in the substrate. The first, second, and third metal layers 212, 214, and 216 define a spiral in a substrate (substrate is not shown) in some implementations.

FIG. 4 also illustrates that the inductor 200 includes the first capture pad 204, the second capture pad 206, a third capture pad 224, a fourth capture pad 226, a first via 234, and a second via 236. In some implementations, the set of windings 202 includes the first pad 204, the second pad 206, the third pad 224, the fourth pad 226, the first via 234, and the second via 236. In some implementations, the first pad 204 is part of the first metal layer 212. The first pad 204 and the first metal layer 212 are on the M1 metal layer. In some implementations, the second pad 206 and/or the third pad 224 are part of the second metal layer 214. The second pad 206, the third pad 224, and the second metal layer 214 are on the M2 metal layer. In some implementations, the fourth pad 226 is part of the third metal layer 216. The fourth pad 226 and the third metal layer 216 are on the M3 metal layer.

The first metal layer 212 is coupled to the first pad 204. The first pad 204 is coupled to the first via 234. The first via 234 is coupled to the third pad 224. The third pad 224 is coupled to the second metal layer 214. The second metal layer 214 is coupled to the second pad 206. The second pad 206 is coupled to the second via 236. The second via 236 is coupled to the fourth pad 226. The fourth pad 226 is coupled to the third metal layer 216.

Figure 5:
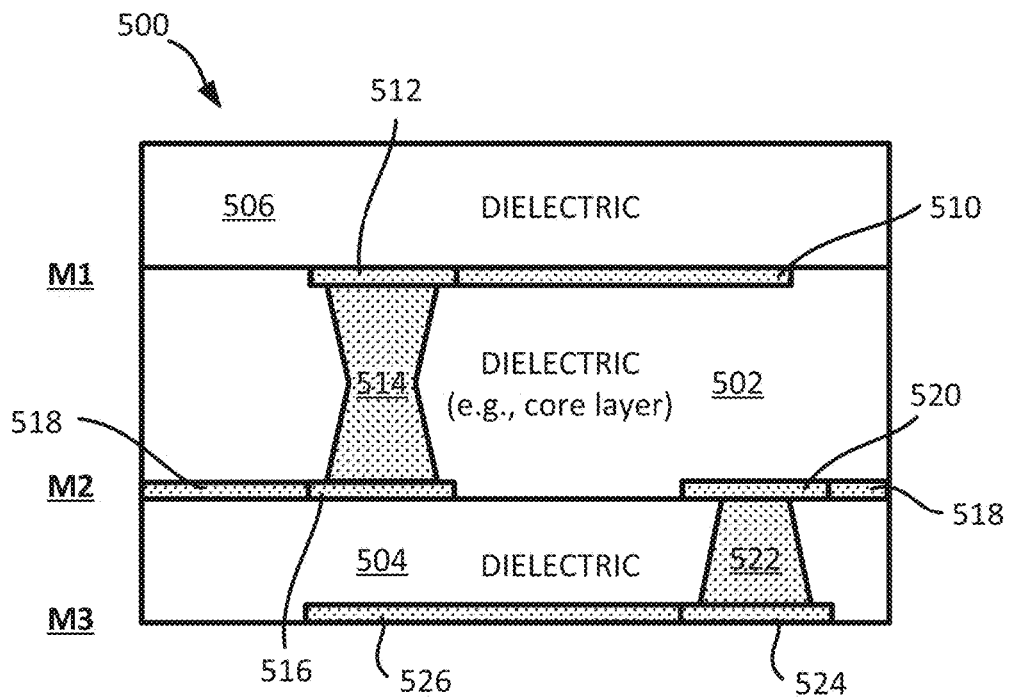
FIG. 5 illustrates another profile view of a novel solenoid inductor.
Figure 6:
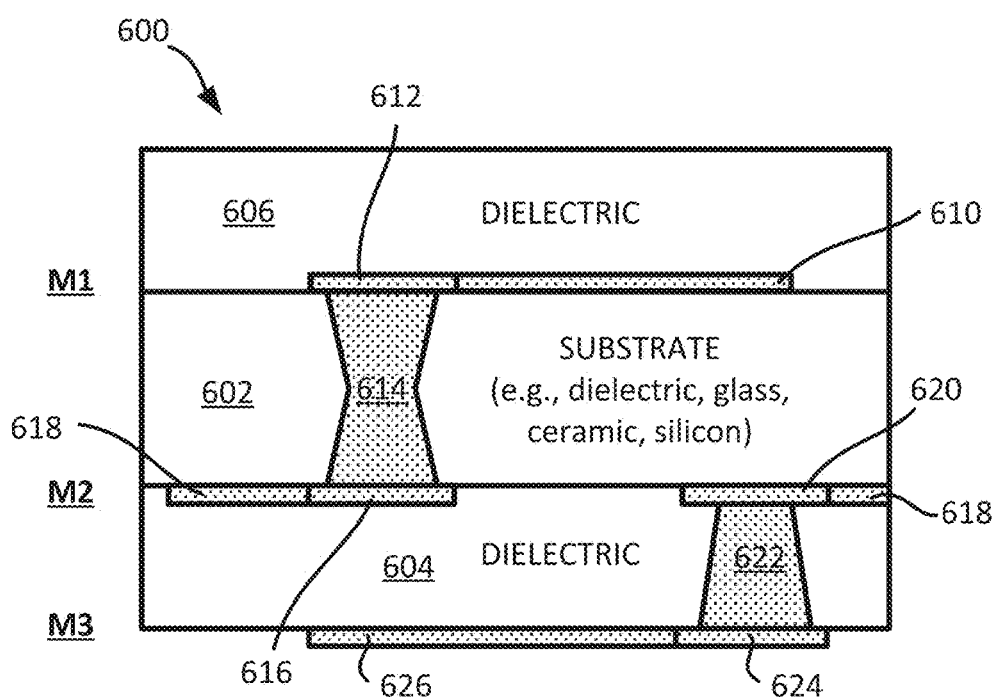
FIG. 6 illustrates yet another profile view of a novel solenoid inductor.

FIGS. 5-6 illustrate a side view of an inductor (e.g., solenoid inductor) in a substrate (e.g., laminated substrate, packaging substrate). In some implementations, FIGS. 5-6 illustrate a side view of the inductor 200 (e.g., solenoid inductor) of FIGS. 2-3 in an integrated device (e.g., substrate). It should be noted that not all components (e.g., interconnects) of the substrate may be visible in FIGS. 5-6.

FIG. 5 illustrates an example of an integrated device 500 that includes a first dielectric layer 502, a second dielectric layer 504, and a third dielectric layer 506. In some implementations, the first dielectric layer 502, the second dielectric layer 504, and the third dielectric layer 506 form and/or define a substrate (e.g., laminated substrate) of the integrated device 500. It should be noted that in some implementations, there may be more than three dielectric layers.

In some implementations, the first dielectric layer 502 is a core layer. In some implementations, the second dielectric layer 504 and the third dielectric layer 506 are prepeg layers. In some implementations, the substrate includes a first interconnect 510, a first pad 512, a first via 514, a second pad 516, and a second interconnect 518, a third pad 520, a second via 522, a fourth pad 524, and a third interconnect 526. In some implementations, the first interconnect 510, the first pad 512, the first via 514, the second pad 516, and the second interconnect 518, the third pad 520, the second via 522, the fourth pad 524, and the third interconnect 526 are configured to operate as an inductor (e.g., solenoid inductor) in the substrate.

The first interconnect 510 is coupled to the first pad 512. The first pad 512 is coupled to the first via 514. The first via 514 is coupled to the second pad 516. The second pad 516 is coupled to the second interconnect 518. The second interconnect 518 is coupled to the third pad 520. The third pad 520 is coupled to the second via 522. The second via 522 is coupled to the fourth pad 524. The fourth pad 524 is coupled to the third interconnect 526.

The first interconnect 510, the first pad 512, the first via 514, the second pad 516, the second interconnect 518, and the third pad 520 are located in the first dielectric layer 502. Moreover, as shown in FIG. 5, the first interconnect 510 and the first pad 512 are metal material (e.g., copper) located on a first metal layer (M1) of the substrate. In addition, the second pad 516, the second interconnect 518, and the third pad 520 are metal material (e.g., copper) located on a second metal layer (M2) of the substrate. The second via 522, the fourth pad 524, and the third interconnect 526 are located in the second dielectric layer 504. The fourth pad 524 and the third interconnect 526 are metal material (e.g., copper) located on a third metal layer (M3) of the substrate.

In some implementations, the first pad 512 corresponds to the pad 204 of FIG. 3. In some implementations, the second pad 516 corresponds to the pad 224 of FIG. 3. In some implementations, the third pad 520 corresponds to the pad 206 of FIG. 3. In some implementations, the fourth pad 524 corresponds to pad 226 of FIG. 3. In some implementations, the interconnects (e.g., interconnects, 510, 518, 526) of FIG. 5 are traces in a substrate (e.g., packaging substrate).

FIG. 6 illustrates another example of an integrated device 600 that includes a substrate layer 602, a first dielectric layer 604, and a second dielectric layer 606. In some implementations, the substrate layer 602, the first dielectric layer 604, and the second dielectric layer 606 form and/or define a packaging substrate of the integrated device 600. It should be noted that in some implementations, there may be more than two or three dielectric layers.

In some implementations, the substrate layer 602 is one of at least a dielectric, glass, ceramic, and/or silicon. In some implementations, the packaging substrate includes a first interconnect 610, a first pad 612, a first via 614, a second pad 616, and a second interconnect 618, a third pad 620, a second via 622, a fourth pad 624, and a third interconnect 626. In some implementations, the first interconnect 610, the first pad 612, the first via 614, the second pad 616, and the second interconnect 618, the third pad 620, the second via 622, the fourth pad 624, and the third interconnect 626 are configured to operate as an inductor (e.g., solenoid inductor) in the packaging substrate.

The first interconnect 610 is coupled to the first pad 612. The first pad 612 is coupled to the first via 614. The first via 614 is coupled to the second pad 616. The second pad 616 is coupled to the second interconnect 618. The second interconnect 618 is coupled to the third pad 620. The third pad 620 is coupled to the second via 622. The second via 622 is coupled to the fourth pad 624. The fourth pad 624 is coupled to the third interconnect 626.

The first interconnect 610 and the first pad 612 are located in the second dielectric layer 606. As shown in FIG. 6, the first interconnect 610 and the first pad 612 are metal material (e.g., copper) located on a first metal layer (M1) of the packaging substrate. The first via 614 is located in the substrate layer 602. The second pad 616, the second interconnect 618, and the third pad 620 are located in the first dielectric layer 604. The second pad 616, the second interconnect 618, and the third pad 620 are metal material (e.g., copper) located on a second metal layer (M2) of the packaging substrate. The fourth pad 624, and the third interconnect 626 are located on the first dielectric layer 604. In some implementations, the fourth pad 624, and the third interconnect 626 are located in another dielectric layer (which is not shown). The fourth pad 624 and the third interconnect 626 are metal material (e.g., copper) located on a third metal layer (M3) of the packaging substrate.

In some implementations, the first pad 612 corresponds to the pad 204 of FIG. 3. In some implementations, the second pad 616 corresponds to the pad 224 of FIG. 3. In some implementations, the third pad 620 corresponds to the pad 206 of FIG. 3. In some implementations, the fourth pad 624 corresponds to pad 226 of FIG. 3. In some implementations, the interconnects (e.g., interconnects 610, 618, 626) are traces in a packaging substrate.

In some implementations, the width of the interconnects (e.g., interconnects 212, 214, 216) of an inductor is less than the width/size/diameter of the vias (e.g., vias 234, 236) and/or pads (e.g., pads 204, 224, 206, 226) of the inductor. In some implementations, the width/size/diameter of the vias (e.g., vias 234, 236) and/or pads (e.g., pads 204, 224, 206, 226) of an inductor is greater than the width of the interconnects (e.g., interconnects 212, 214, 216) of the inductor. For example, an interconnect may have a first width, a pad (e.g., capture pad) may have a second width (e.g., second diameter), and a via may have a third width (e.g., third diameter). In some implementations, the first width may be less than the second width. In some implementations, the first width may be less than the third width. In some implementations, the width of an interconnect is defined as the difference between the outer radius of the inductor and the inner radius of the inductor (e.g., half of the difference between the outer circumference and inner circumference of the inductor). It should also be noted that in some implementations, the pads (e.g., capture pads) of the inductor may overlap with the interconnects of the inductor.

In some implementations, the inductor (e.g., solenoid inductor) may have more turns, and/or may be on more than 3 metal layers in substrate. One or more examples of such an inductor (e.g., solenoid inductor) will be described in FIGS. 9-13.

Exemplary Solenoid Inductor in a Substrate with Non-Circular Winding

Figure 7:
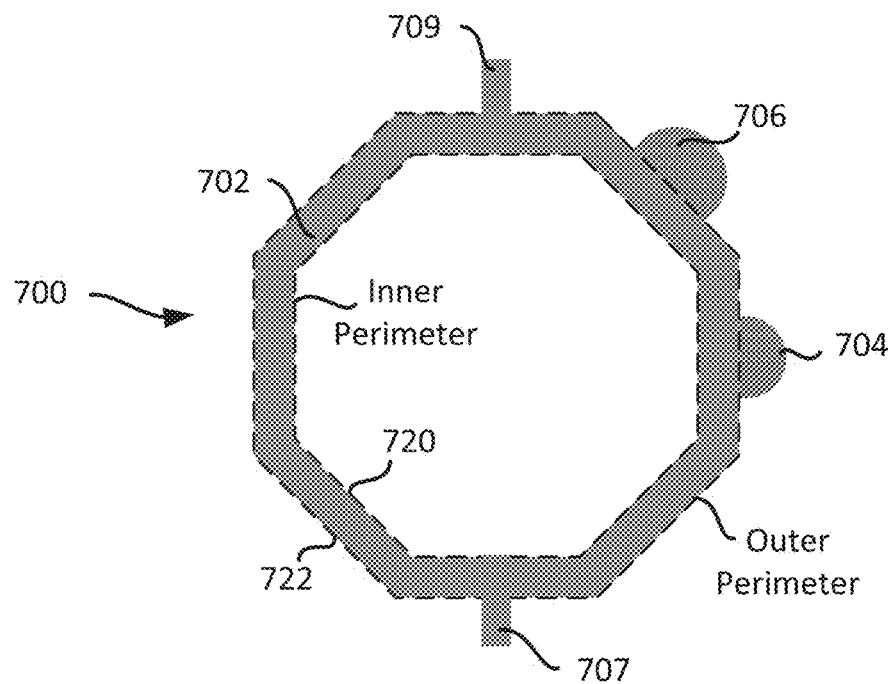
FIG. 7 illustrates a plan view of a novel solenoid inductor with non-circular windings.
Figure 8:
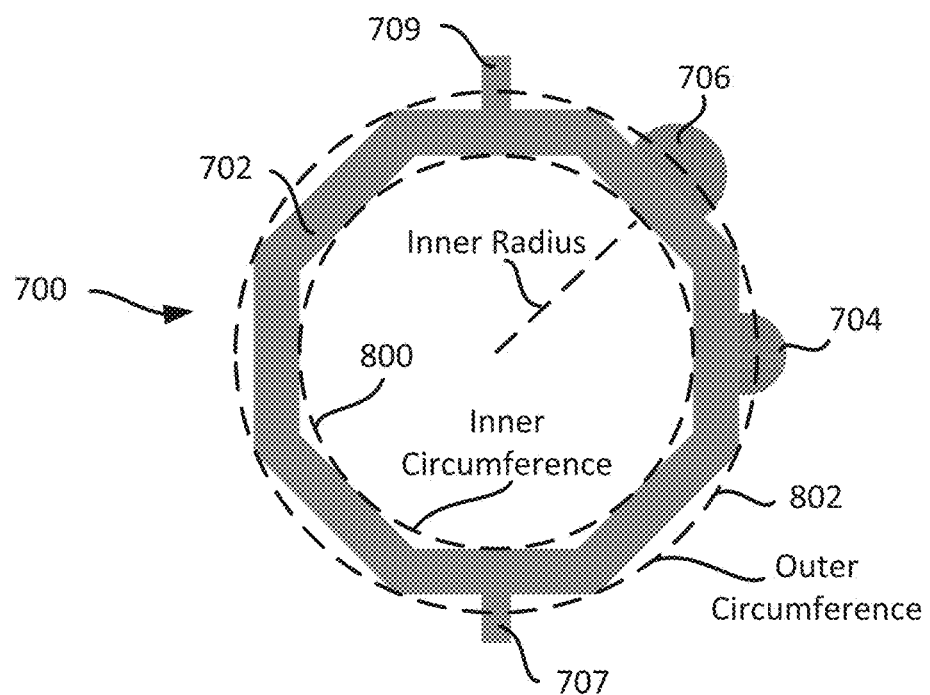
FIG. 8 illustrates a plan view of a novel solenoid inductor with non-circular windings.

FIGS. 7-8 conceptually illustrate a novel inductor for a device (e.g., integrated device, semiconductor device). Specifically, FIG. 7 illustrates a top view of an inductor 700 that includes a set of windings 702, a first capture pad 704, a second capture pad 706, a first port 707, and a second port 709. The set of windings 702 is non-circular. In particular, the set of windings 702 form an octagonal spiral. In some implementations, the inductor 700 is a solenoid inductor. In some implementations, the inductor 700 is located in a substrate (e.g., laminated substrate, glass substrate, ceramic substrate, silicon substrate). The set of windings 702 includes spiral interconnects (e.g., metal layers). In some implementations, the inductor 700 is similar to the inductor 200 of FIG. 2, except that the inductor 200 has a circular spiral, while the inductor 700 has an octagonal spiral.

As show in FIG. 7, the inductor 700 has an inner perimeter 720 and an outer perimeter 722. In some implementations, the set of windings 702 has the inner perimeter 720 and the outer perimeter 722. As further shown in FIG. 7, none of the components of the inductor 700 are located within the inner perimeter 720. That is, all of the components of the inductor 700 are on or outside the inner perimeter 720. In some implementations, the first pad 704 and the second pad 706 are outside the inner perimeter 720 in order to reduce/minimize eddy current loss. In some implementations, reducing/minimizing the eddy current loss can result in an increase in the quality factor (Q) of the set of windings 702 and/or inductor 700.

FIG. 7 also illustrates that the first capture pad 704 and the second capture pad 706 protrude away from the inner perimeter 720 and the outer perimeter 722. In particular, as shown in FIG. 7, in some implementations, at least a portion (e.g., some or all) of the first pad 704 is outside the outer perimeter 722 of the set of windings 702. Similarly, in some implementations, at least a portion (e.g., some or all) of the second pad 706 is outside the outer perimeter 722 of the set of windings 702. In some implementations, at least a portion of the first pad 704 and at least a portion of the second pad 706 are outside the outer perimeter 722 in order to reduce/minimize eddy current loss. In some implementations, reducing/minimizing the eddy current loss can result in an increase in the quality factor (Q) of the set of windings 702 and/or inductor 700.

FIG. 8 illustrates the inductor 700 of FIG. 7 with inner and outer circumferences shown. Specifically, FIG. 8 illustrates the inner circumference 800 and the outer circumference 802 of the inductor 700. In some implementations, the set of windings 702 has the inner circumference 800 and the outer circumference 802. The inner circumference 800 has an inner radius. As further shown in FIG. 7, none of the components of the inductor 700 are located within the inner circumference 800. That is, all of the components of the inductor 700 are on or outside the inner circumference 800. In some implementations, the first pad 704 and the second pad 706 are outside the inner circumference 800 in order to reduce/minimize eddy current loss. In some implementations, reducing/minimizing the eddy current loss can result in an increase in the quality factor (Q) of the set of windings 702 and/or inductor 700.

FIG. 8 also illustrates that the first capture pad 704 and the second capture pad 706 protrude away from the inner circumference 800 and the outer circumference 802. In particular, as shown in FIG. 8, in some implementations, at least a portion (e.g., some or all) of the first pad 704 is outside the outer circumference 802 of the set of windings 702. Similarly, in some implementations, at least a portion (e.g., some or all) of the second pad 706 is outside the outer circumference 802 of the set of windings 702. In some implementations, at least a portion of the first pad 704 and at least a portion of the second pad 706 are outside the outer circumference 802 in order to reduce/minimize eddy current loss. In some implementations, reducing/minimizing the eddy current loss can result in an increase in the quality factor (Q) of the set of windings 702 and/or inductor 700.

In some implementations, the inductor 700 of FIGS. 7-8 may have a similar and/or identical structure and/or profile as the inductors shown and described in FIGS. 3-6.

In some implementations, for purposes of defining and/or determining the perimeter (e.g., inner perimeter, outer perimeter, inner circumference, outer circumference) of the set of windings, the position and/or dimension of the set pads that are coupled to the set of windings shall not be considered or taken into account (i.e., the set of pads shall be excluded when defining and/or determining the perimeter (e.g., inner perimeter, outer perimeter, inner circumference, outer circumference) of the set of windings). Similarly, in some implementations, for purposes of defining and/or determining the perimeter (e.g., inner perimeter, outer perimeter, inner circumference, outer circumference) of the set of windings, the position and/or dimension of the set vias that are coupled to the set of windings shall not be considered or taken into account (i.e., the set of vias shall be excluded when defining and/or determining the perimeter of the set of windings). For example, in some implementations, only the set of interconnects shall be taken into account when defining and/or determining the perimeter (e.g., inner perimeter, outer perimeter, inner circumference, outer circumference) of the set of windings.

Exemplary Solenoid Inductor in a Substrate

Figure 9:
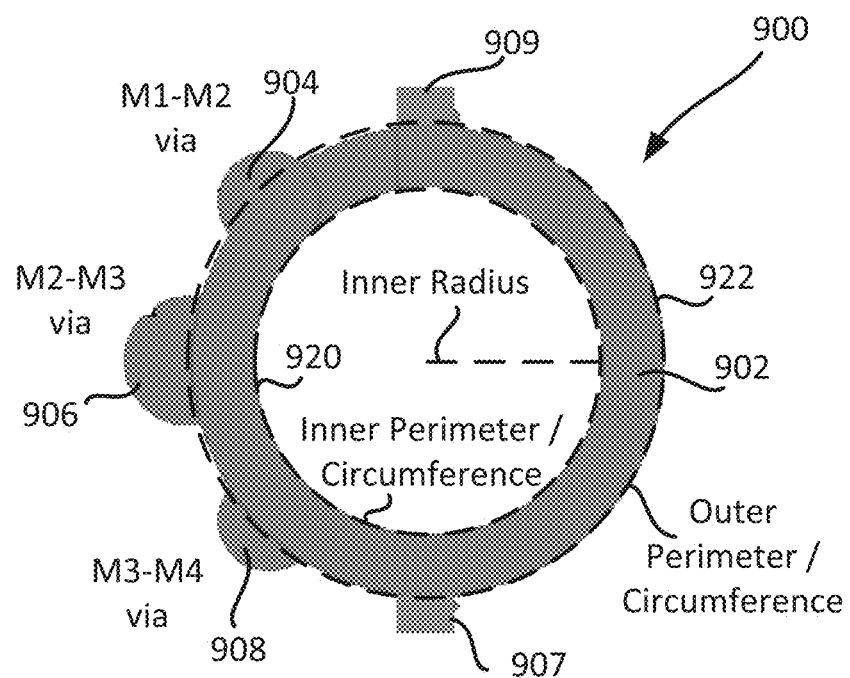
FIG. 9 illustrates a plan view of another novel solenoid inductor.
Figure 10:
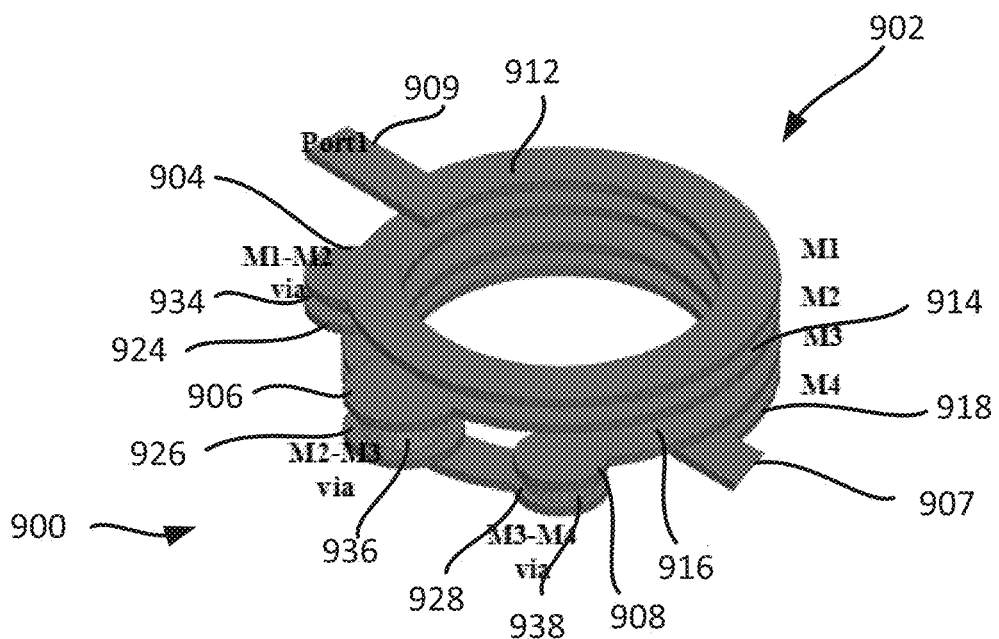
FIG. 10 illustrates an angled view of another novel solenoid inductor.

FIGS. 9-10 conceptually illustrate another novel inductor for a device (e.g., semiconductor device). Specifically, FIG. 9 illustrates a top view of an inductor 900 that includes a set of windings 902, a first pad 904, a second pad 906, a third pad 908, a first port 907, and a second port 909. In some implementations, the inductor 900 is located in a substrate (e.g. laminated substrate, glass substrate, ceramic substrate, silicon substrate). The set of windings 902 includes spiral interconnects (e.g., metal layers). As show in FIG. 9, the inductor 900 has an inner perimeter 920 (e.g., inner circumference) and an outer perimeter 922 (e.g., outer circumference). In some implementations, the set of windings 902 has the inner perimeter 920 and the outer perimeter 922. The inner perimeter 920 has an inner radius. As further shown in FIG. 9, none of the components of the inductor 900 are located within the inner perimeter 920. That is, all of the components of the inductor 900 are on or outside the inner perimeter 920.

In some implementations, the first pad 904, the second pad 906, and the third pad 908 are outside the inner perimeter 920 in order to reduce/minimize eddy current loss. In some implementations, reducing/minimizing the eddy current loss can result in an increase in the quality factor (Q) of the set of windings 902 and/or inductor 900.

FIG. 9 also illustrates that the first pad 904, the second pad 906, and the third pad 908 protrude away from the inner perimeter 920 and the outer perimeter 922. In particular, as shown in FIG. 9, in some implementations, at least a portion (e.g., some or all) of the first pad 904 is outside the outer perimeter 922 of the set of windings 902. Similarly, in some implementations, at least a portion (e.g., some or all) of the second pad 906 is outside the outer perimeter 922 of the set of windings 902. Moreover, in some implementations, at least a portion (e.g., some or all) of the third pad 908 is outside the outer perimeter 922 of the set of windings 902. In some implementations, at least a portion of the first pad 904, at least a portion of the second pad 906, and at least a portion of the third pad 908 are outside the outer perimeter 922 in order to reduce/minimize eddy current loss. In some implementations, reducing/minimizing the eddy current loss can result in an increase in the quality factor (Q) of the set of windings 902 and/or inductor 900.

FIG. 10 illustrates an angled view of the inductor 900. In some implementations, the inductor 900 is a solenoid inductor. As shown in FIG. 9, the set of windings 902 includes a first metal layer 912, a second metal layer 914, a third metal layer 916, and a fourth metal layer 918. In some implementations, the first metal layer 912 is a first interconnect in a substrate (e.g. laminated substrate, glass substrate, ceramic substrate, silicon substrate). In some implementations, the second metal layer 914 is a second interconnect in the substrate. In some implementations, the third metal layer 916 is a third interconnect in the substrate. In some implementations, the fourth metal layer 918 is a fourth interconnect in the substrate. The first, second, third, and fourth metal layers 912, 914, 916 and 918 define a spiral in a substrate (e.g., packaging substrate) in some implementations. The first metal layer 912 is coupled to the second port 909. The fourth metal layer 918 is coupled to the first port 907.

FIG. 10 also illustrates that the inductor 900 includes the first pad 904, the second pad 906, the third pad 908, a fourth pad 924, a fifth pad 926, a sixth pad 928, a first via 934, a second via 936, and a third via 938. In some implementations, the set of windings 902 includes the first pad 904, the second pad 906, the third pad 908, the fourth pad 924, the fifth pad 926, the sixth pad 928, the first via 934, the second via 936, and the third via 938. In some implementations, the first pad 904 is part of the first metal layer 912. In some implementations, the second pad 906 is part of the second metal layer 914. In some implementations, the third pad 908 is part of the third metal layer 916.

As shown in FIG. 10, the second port 909 is coupled to the first metal layer 912. The first metal layer 912 is coupled to the first pad 904. The first pad 904 is coupled to the first via 934. The first via 934 is coupled to the fourth pad 924. The fourth via 924 is coupled to the second metal layer 914. The second metal layer 914 is coupled to the second pad 906. The second pad 906 is coupled to the second via 936. The second via 936 is coupled to the fifth pad 926. The fifth pad 926 is coupled to the third metal layer 916. The third metal layer 916 is coupled to the third pad 908. The third pad 908 is coupled to the third via 938. The third via 938 is coupled to the sixth pad 928. The sixth pad 928 is coupled to the fourth metal layer 918. The fourth metal layer 918 is coupled to the fifth port 907. None of the components of the inductor 900 are located within the inner perimeter 920. That is, all of the components of the inductor 900 are on or outside the inner perimeter 920.

In some implementations, the first pad 904, the second pad 906, the third pad 908, the fourth pad 924, the fifth pad 926, and the sixth pad 928 are outside the inner perimeter 920 in order to reduce/minimize eddy current loss. In some implementations, reducing/minimizing the eddy current loss can result in an increase in the quality factor (Q) of the set of windings 902 and/or inductor 900.

FIG. 10 also illustrates that the first pad 904, the second pad 906, the third pad 908, the fourth pad 924, the fifth pad 926, and the sixth pad 928 protrude away from the inner perimeter 920 and the outer perimeter 922 (e.g., away from the inner portion of the solenoid inductor). As shown in FIG. 10, in some implementations, at least a portion (e.g., some or all) of the first pad 904 is outside the outer perimeter 922 of the set of windings 902. Similarly, in some implementations, at least a portion (e.g., some or all) of the second pad 906 is outside the outer perimeter 922 of the set of windings 902. Additionally, in some implementations, at least a portion (e.g., some or all) of the third pad 908 is outside the outer perimeter 922 of the set of windings 902.

Moreover, in some implementations, at least a portion (e.g., some or all) of the fourth pad 924 is outside the outer perimeter 922 of the set of windings 902. Similarly, in some implementations, at least a portion (e.g., some or all) of the fifth pad 926 is outside the outer perimeter 922 of the set of windings 902. Additionally, in some implementations, at least a portion (e.g., some or all) of the sixth pad 928 is outside the outer perimeter 922 of the set of windings 202.

In some implementations, at least a portion of the first pad 904, at least a portion of the second pad 906, at least a portion of the third pad 908, and at least a portion of the fourth pad 924, at least a portion of the fifth pad 926, and at least a portion sixth pad 928 are outside the outer perimeter 922 in order to reduce/minimize eddy current loss. In some implementations, reducing/minimizing the eddy current loss can result in an increase in the quality factor (Q) of the set of windings 902 and/or inductor 900.

Although FIGS. 9-10 illustrate an inductor (e.g., solenoid inductor) that includes a circular set of windings, in some implementations, the set of windings may be non-circular (e.g., oval, square, rectangular, hexagonal, octagonal) In instances where non-circular windings are used, these non-circular set of windings may still have an inner perimeter, an outer perimeter, an inner circumference, and an outer circumference. Examples of non-circular windings for an inductor are described in FIGS. 14-15.

In some implementations, for purposes of defining and/or determining the perimeter (e.g., inner perimeter, outer perimeter, inner circumference, outer circumference) of the set of windings, the position and/or dimension of the set pads that are coupled to the set of windings shall not be considered or taken into account (i.e., the set of pads shall be excluded when defining and/or determining the perimeter (e.g., inner perimeter, outer perimeter, inner circumference, outer circumference) of the set of windings). Similarly, in some implementations, for purposes of defining and/or determining the perimeter (e.g., inner perimeter, outer perimeter, inner circumference, outer circumference) of the set of windings, the position and/or dimension of the set vias that are coupled to the set of windings shall not be considered or taken into account (i.e., the set of vias shall be excluded when defining and/or determining the perimeter of the set of windings). For example, in some implementations, only the set of interconnects shall be taken into account when defining and/or determining the perimeter (e.g., inner perimeter, outer perimeter, inner circumference, outer circumference) of the set of windings.

Figure 11:
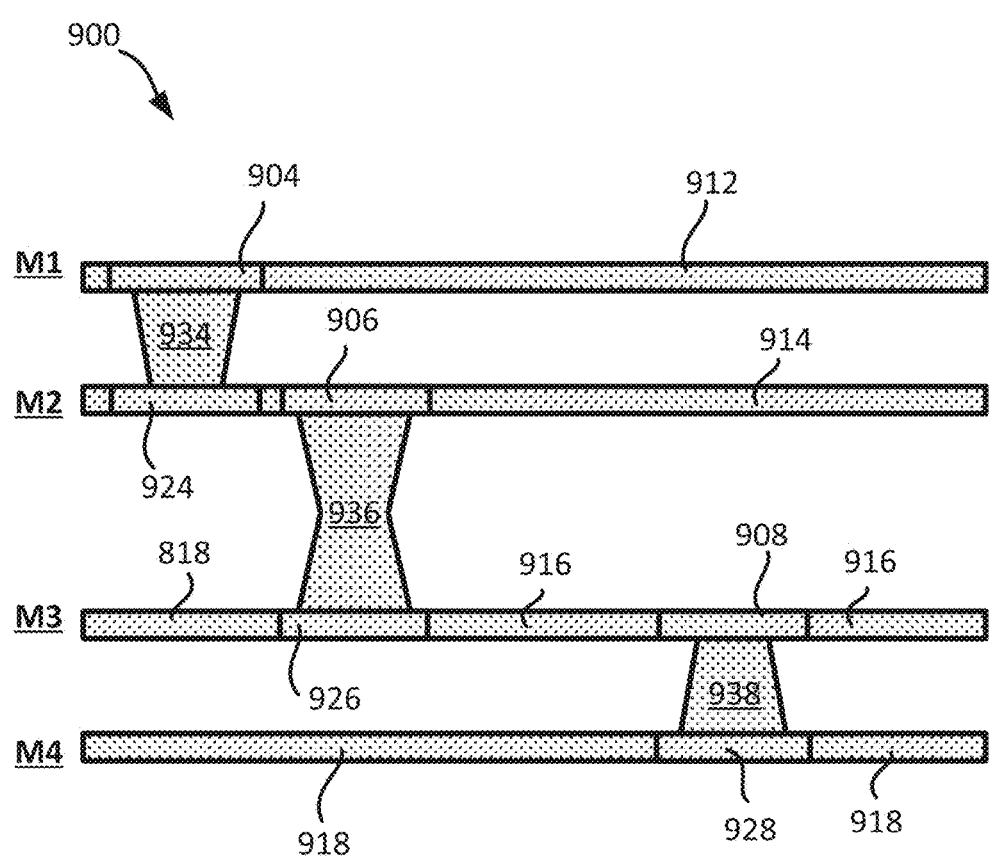
FIG. 11 illustrates a profile view of a novel solenoid inductor.

FIG. 11 illustrates a profile view of the inductor 900. In some implementations, the inductor 900 is a solenoid inductor. As shown in FIG. 11, the set of windings 902 includes a first metal layer 912, a second metal layer 914, a third metal layer 916, and a fourth metal layer 918. In some implementations, the first metal layer 912 is a first interconnect in a substrate (not shown). In some implementations, the second metal layer 914 is a second interconnect in the substrate. In some implementations, the third metal layer 916 is a third interconnect in the substrate. In some implementations, the fourth metal layer 918 is a fourth interconnect in the substrate. The first, second, third, and fourth metal layers 912, 914, 916 and 918 define a spiral in a substrate (e.g., packaging substrate) in some implementations.

FIG. 11 also illustrates that the inductor 900 includes the first pad 904, the second pad 906, the third pad 908, a fourth pad 924, a fifth pad 926, a sixth pad 928, a first via 934, a second via 936, and a third via 938. In some implementations, the set of windings 902 includes the first pad 904, the second pad 906, the third pad 908, the fourth pad 924, the fifth pad 926, the sixth pad 928, the first via 934, the second via 936, and the third via 938. In some implementations, the first pad 904 is part of the first metal layer 912. The first pad 904 and the first metal layer 912 are on the M1 metal layer. In some implementations, the second pad 906 and/or the fourth pad 924 are part of the second metal layer 914. The second pad 906, the fourth pad 924, and the second metal layer 914 are on the M2 metal layer. In some implementations, the third pad 908, the fifth pad 926 are part of the third metal layer 916. The third pad 908, the fifth pad 926, and the third metal layer 916 are on the M3 metal layer. In some implementations, the sixth pad 928 is part of the fourth metal layer 918. The sixth pad 928 and the fourth metal layer 918 are on the M4 metal layer.

Figure 12:
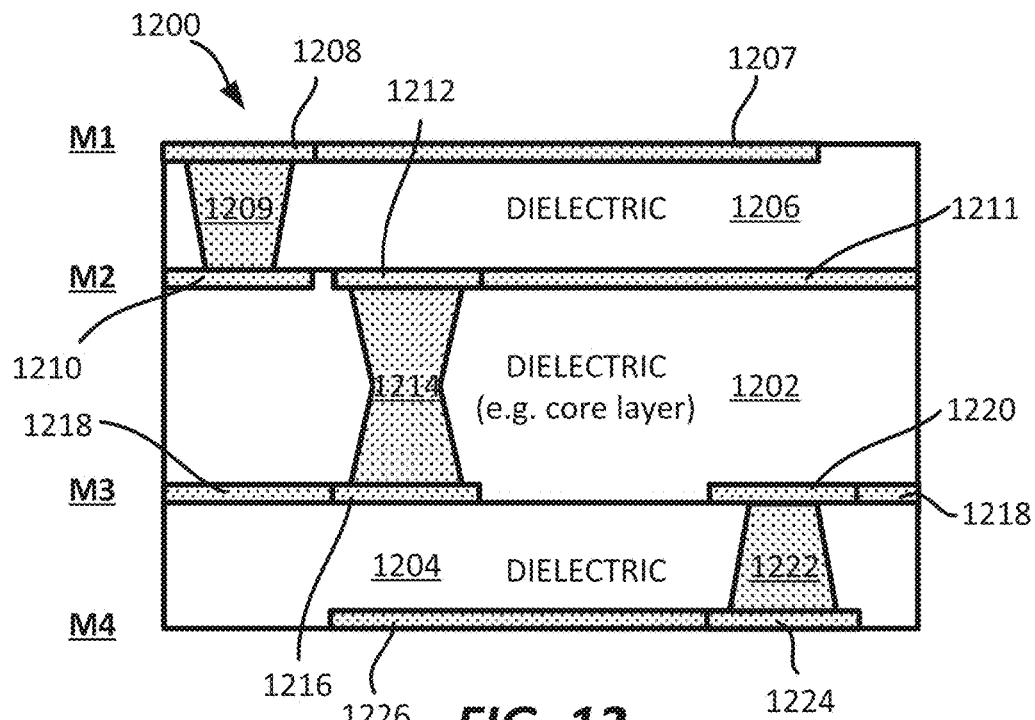
FIG. 12 illustrates another profile view of another novel solenoid inductor.
Figure 13:
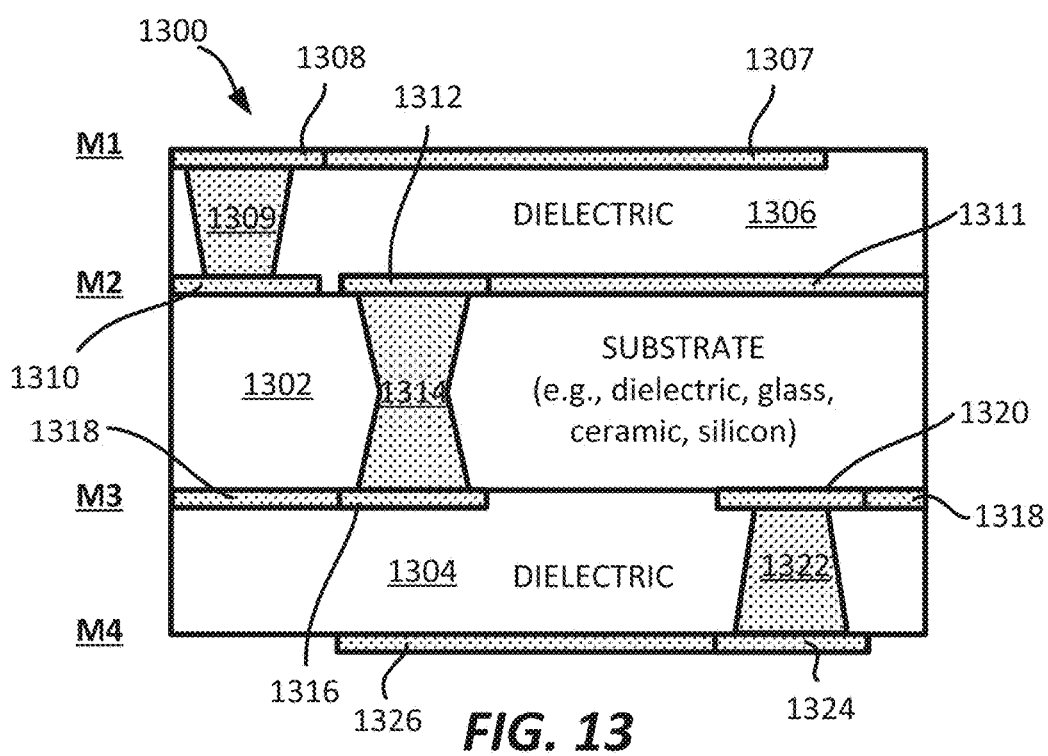
FIG. 13 illustrates yet another profile view of another novel solenoid inductor.

FIGS. 12-13 illustrate a side view of an inductor (e.g., solenoid inductor) in a substrate (e.g., laminated substrate, packaging substrate). In some implementations, FIGS. 12-13 illustrate a side view of the inductor 900 (e.g., solenoid inductor) of FIGS. 9-10 in an integrated device (e.g., substrate). It should be noted that not all components (e.g., interconnects) of the substrate may be visible in FIGS. 12-13.

FIG. 12 illustrates an example of an integrated device 1200 that includes a first dielectric layer 1202, a second dielectric layer 1204, and a third dielectric layer 1206. In some implementations, the first dielectric layer 1202, the second dielectric layer 1204, and the third dielectric layer 1206 form and/or define a substrate (e.g., laminated substrate) of the integrated device 1200. It should be noted that in some implementations, there may be more than three dielectric layers.

In some implementations, the first dielectric layer 1202 is a core layer. In some implementations, the second dielectric layer 1204 and the third dielectric layer 1206 are prepeg layers. In some implementations, the substrate includes a first interconnect 1207, a first pad 1208, a first via 1209, a second pad 1210, a second interconnect 1211, a third pad 1212, a second via 1214, a fourth pad 1216, a third interconnect 1218, a fifth pad 1220, a third via 1222, a sixth pad 1224, and a fourth interconnect 1226. In some implementations, the first interconnect 1207, the first pad 1208, the first via 1209, the second pad 1210, the second interconnect 1211, the third pad 1212, the second via 1214, the fourth pad 1216, the third interconnect 1218, the fifth pad 1220, the third via 1222, the sixth pad 1224, and the fourth interconnect 1226 are configured to operate as an inductor (e.g., solenoid inductor) in the substrate.

The first interconnect 1207 is coupled to the first pad 1208. The first pad 1208 is coupled to the first via 1209. The first via 1209 is coupled to the second pad 1210. The second pad 1210 is coupled to the second interconnect 1211. The second interconnect 1211 is coupled to the third pad 1212. The third pad 1212 is coupled to the second via 1214. The second via 1214 is coupled to the fourth pad 1216. The fourth pad 1216 is coupled to the third interconnect 1218. The third interconnect 1218 is coupled to the fifth pad 1220. The fifth pad 1220 is coupled to the third via 1222. The third via 1222 is coupled to the sixth pad 1224. The sixth pad 1224 is coupled to the fourth interconnect 1226.

The first interconnect 1207, the first pad 1208, the first via 1209 are located in the third dielectric layer 1206. Moreover, as shown in FIG. 12, the first interconnect 1207 and the first pad 1208 are metal material (e.g., copper) located on a first metal layer (M1) of the substrate. The second pad 1210, the second interconnect 1211, the third pad 1212, the second via 1214, the fourth pad 1216, the third interconnect 1218, and the fifth pad 1220 are located in the first dielectric layer 1202. In addition, the second pad 1210, the second interconnect 1211, and the third pad 1212 are metal material (e.g., copper) located on a second metal layer (M2) of the substrate. The fourth pad 1216, the third interconnect 1218, and the fifth pad 1220 are metal material (e.g., copper) located on a third metal layer (M3) of the substrate. The third via 1222, the sixth pad 1224, and the fourth interconnect 1226 are located in the second dielectric layer 1204. The sixth pad 1224 and the fourth interconnect 1226 are metal material (e.g., copper) located on a fourth metal layer (M4) of the substrate.

In some implementations, the first pad 1208 corresponds to the pad 904 of FIG. 3. In some implementations, the second pad 1210 corresponds to the pad 924 of FIG. 9. In some implementations, the third pad 1212 corresponds to the pad 906 of FIG. 9. In some implementations, the fourth pad 1216 corresponds to pad 926 of FIG. 9. In some implementations, the fifth pad 1220 corresponds to the pad 908 of FIG. 9. In some implementations, the sixth pad 1224 corresponds to pad 928 of FIG. 9. In some implementations, the interconnects (e.g., interconnects, 1207, 1210, 1218, 1226) of FIG. 12 are traces in a substrate (e.g., packaging substrate).

FIG. 13 illustrates another example of an integrated device 1300 that includes a substrate layer 1302, a first dielectric layer 1304, and a second dielectric layer 1306. In some implementations, the substrate layer 1302, the first dielectric layer 1304, and the second dielectric layer 1306 form and/or define a packaging substrate of the integrated device 1300. It should be noted that in some implementations, there may be more than two or three dielectric layers.

In some implementations, the substrate layer 1302 is one of at least a dielectric, glass, and/or silicon. In some implementations, the substrate includes a first interconnect 1307, a first pad 1308, a first via 1309, a second pad 1310, a second interconnect 1311, a third pad 1312, a second via 1314, a fourth pad 1316, a third interconnect 1318, a fifth pad 1320, a third via 1322, a sixth pad 1324, and a fourth interconnect 1326. In some implementations, the first interconnect 1307, the first pad 1308, the first via 1309, the second pad 1310, the second interconnect 1311, the third pad 1312, the second via 1314, the fourth pad 1316, the third interconnect 1318, the fifth pad 1320, the third via 1322, the sixth pad 1324, and the fourth interconnect 1326 are configured to operate as an inductor (e.g., solenoid inductor) in the substrate.

The first interconnect 1307 is coupled to the first pad 1308. The first pad 1308 is coupled to the first via 1309. The first via 1309 is coupled to the second pad 1310. The second pad 1310 is coupled to the second interconnect 1311. The second interconnect 1311 is coupled to the third pad 1312. The third pad 1312 is coupled to the second via 1314. The second via 1314 is coupled to the fourth pad 1316. The fourth pad 1316 is coupled to the third interconnect 1318. The third interconnect 1318 is coupled to the fifth pad 1320. The fifth pad 1320 is coupled to the third via 1322. The third via 1322 is coupled to the sixth pad 1324. The sixth pad 1324 is coupled to the fourth interconnect 1326.

The first interconnect 1307, the first pad 1308, the first via 1309, the second pad 1310, the second interconnect 1310, and the third pad 1312 are located in the second dielectric layer 1306. Moreover, as shown in FIG. 13, the first interconnect 1307 and the first pad 1308 are metal material (e.g., copper) located on a first metal layer (M1) of the substrate. In addition, the second pad 1310, the second interconnect 1311, and the third pad 1312 are metal material (e.g., copper) located on a second metal layer (M2) of the substrate. The second via 1314 is located in the substrate 1302. The fourth pad 1316, the third interconnect 1318, the fifth pad 1320, and the third via 1322 are located in the first dielectric layer 1304. The fourth pad 1316, the third interconnect 1318, and the fifth pad 1320 are metal material (e.g., copper) located on a third metal layer (M3) of the substrate. The sixth pad 1324 and the fourth interconnect 1326 are located on the first dielectric layer 1304. In some implementations, the sixth pad 1324 and the fourth interconnect 1326 are located in another dielectric layer (not shown). The sixth pad 1324 and the fourth interconnect 1326 are metal material (e.g., copper) located on a fourth metal layer (M4) of the substrate.

In some implementations, the first pad 1308 corresponds to the pad 904 of FIG. 3. In some implementations, the second pad 1310 corresponds to the pad 924 of FIG. 9. In some implementations, the third pad 1312 corresponds to the pad 906 of FIG. 9. In some implementations, the fourth pad 1316 corresponds to the pad 926 of FIG. 9. In some implementations, the fifth pad 1320 corresponds to the pad 908 of FIG. 9. In some implementations, the sixth pad 1324 corresponds to pad 928 of FIG. 9. In some implementations, the interconnects (e.g., interconnects, 1307, 1311, 1318, 1326) of FIG. 13 are traces in a substrate (e.g., packaging substrate).

In some implementations, the width of the interconnects (e.g., interconnects 912, 914, 916, 918) of an inductor is less than the width/size/diameter of the vias (e.g., vias 934, 936, 938) and/or pads (e.g., pads 904, 924, 906, 926, 908, 928) of the inductor. In some implementations, the width/size/diameter of the vias (e.g., vias 934, 936, 938) and/or pads (e.g., pads 904, 924, 906, 926, 908, 928) of an inductor is greater than the width of the interconnects (e.g., interconnects 912, 914, 916, 918) of the inductor. For example, an interconnect may have a first width, a pad (e.g., capture pad) may have a second width (e.g., second diameter), and a via may have a third width (e.g., third diameter). In some implementations, the first width may be less than the second width. In some implementations, the first width may be less than the third width. In some implementations, the width of an interconnect is defined as the difference between the outer radius of the inductor and the inner radius of the inductor (e.g., half of the difference between the outer circumference and inner circumference of the inductor). It should also be noted that in some implementations, the pads (e.g., capture pads) of the inductor may overlap with the interconnects of the inductor.

Exemplary Solenoid Inductor in a Substrate with a Non-Circular Winding

Figure 14:
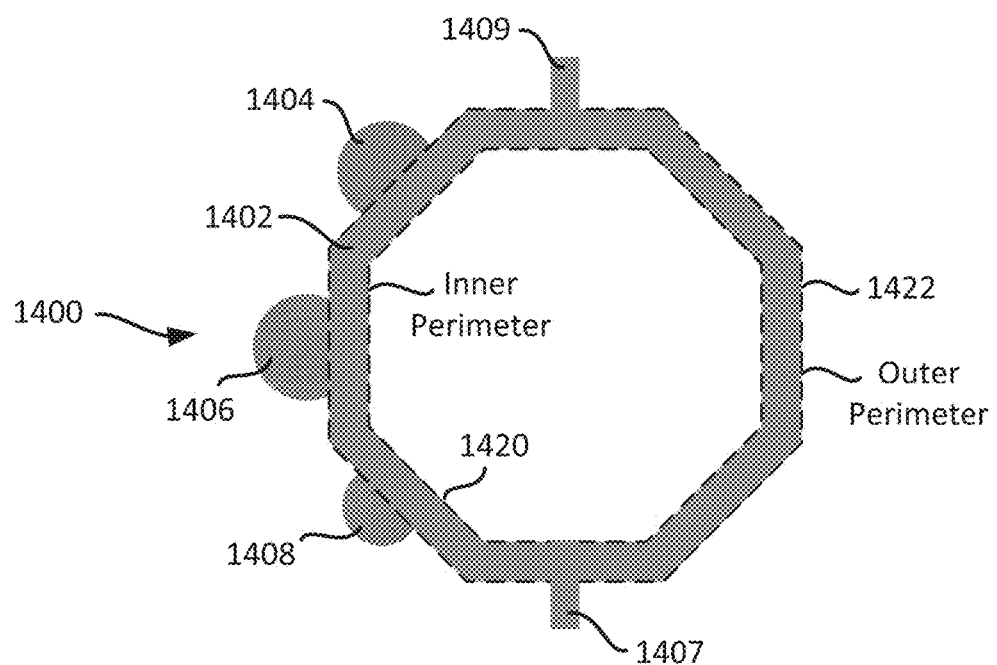
FIG. 14 illustrates a plan view of a novel solenoid inductor with non-circular windings.
Figure 15:
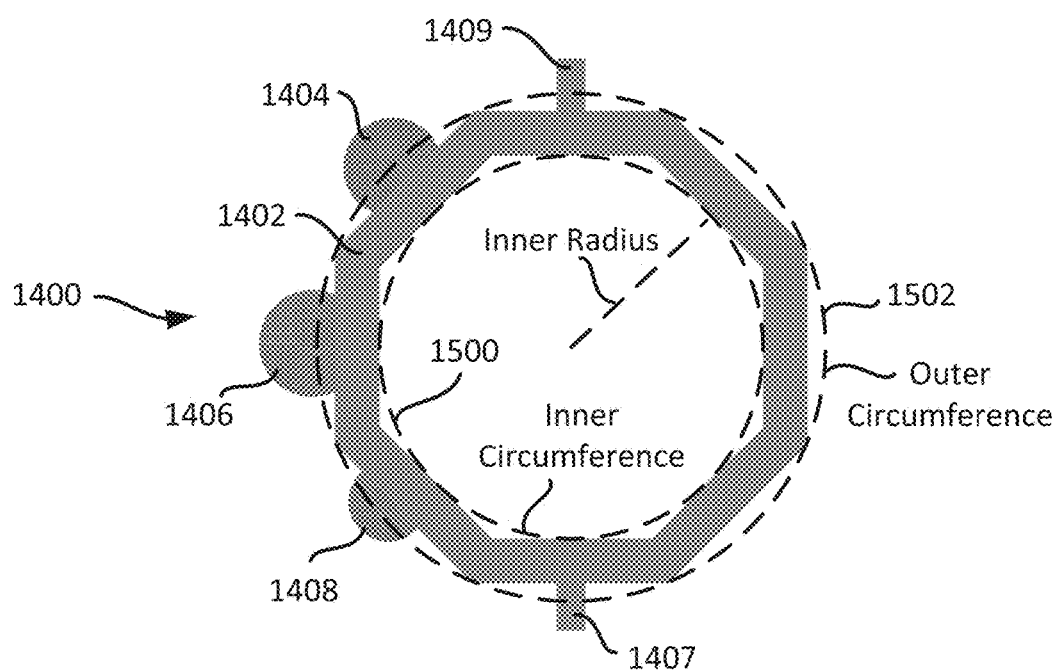
FIG. 15 illustrates a plan view of a novel solenoid inductor with non-circular windings.

FIGS. 14-15 conceptually illustrate another novel inductor for a device (e.g., semiconductor device). Specifically, FIG. 14 illustrates a top view of an inductor 1400 that includes a set of windings 1402, a first pad 1404, a second pad 1406, a third pad 1408, a first port 1407, and a second port 1409. In some implementations, the inductor 1400 is located in a substrate and/or a die. The set of windings 1402 includes octagonal spiral interconnects (e.g., metal layers). In some implementations, the inductor 1400 is similar to the inductor 900 of FIG. 9, except that the inductor 900 has a circular spiral, while the inductor 1400 has an octagonal spiral.

As show in FIG. 14, the inductor 1400 has an inner perimeter 1420 and an outer perimeter 1422. In some implementations, the set of windings 1402 has the inner perimeter 1420 and the outer perimeter 1422. As further shown in FIG. 14, none of the components of the inductor 1400 are located within the inner perimeter 1420. That is, all of the components of the inductor 1400 are on or outside the inner perimeter 1420.

In some implementations, the first pad 1404, the second pad 1406, and the third pad 1408 are outside the inner perimeter 1420 in order to reduce/minimize eddy current loss. In some implementations, reducing/minimizing the eddy current loss can result in an increase in the quality factor (Q) of the set of windings 1402 and/or inductor 1400.

FIG. 14 also illustrates that the first pad 1404, the second pad 1406, and the third pad 1408 protrude away from the inner perimeter 1420 and the outer perimeter 1422. In particular, as shown in FIG. 14, in some implementations, at least a portion (e.g., some or all) of the first pad 1404 is outside the outer perimeter 1422 of the set of windings 1402. Similarly, in some implementations, at least a portion (e.g., some or all) of the second pad 1406 is outside the outer perimeter 1422 of the set of windings 1402. Moreover, in some implementations, at least a portion (e.g., some or all) of the third pad 1408 is outside the outer perimeter 1422 of the set of windings 1402. In some implementations, at least a portion of the first pad 1404, at least a portion of the second pad 1406, and at least a portion of the third pad 1408 are outside the outer perimeter 1422 in order to reduce/minimize eddy current loss. In some implementations, reducing/minimizing the eddy current loss can result in an increase in the quality factor (Q) of the set of windings 1402 and/or inductor 1400.

In some implementations, the first pad 1404, the second pad 1406, and the third pad 1408 are outside the inner perimeter 1420 in order to reduce/minimize eddy current loss. In some implementations, reducing/minimizing the eddy current loss can result in an increase in the quality factor (Q) of the set of windings 1402 and/or inductor 1400.

FIG. 14 also illustrates that the first pad 1404, the second pad 1406, and the third pad 1408 protrude away from the inner perimeter 1420 and the outer perimeter 1422. In particular, as shown in FIG. 14, in some implementations, at least a portion (e.g., some or all) of the first pad 1404 is outside the outer perimeter 1422 of the set of windings 1402. Similarly, in some implementations, at least a portion (e.g., some or all) of the second pad 1406 is outside the outer perimeter 1422 of the set of windings 1402. Moreover, in some implementations, at least a portion (e.g., some or all) of the third pad 1408 is outside the outer perimeter 1422 of the set of windings 1402. In some implementations, at least a portion of the first pad 1404, at least a portion of the second pad 1406, and at least a portion of the third pad 1408 are outside the outer perimeter 1422 in order to reduce/minimize eddy current loss. In some implementations, reducing/minimizing the eddy current loss can result in an increase in the quality factor (Q) of the set of windings 1402 and/or inductor 1400.

FIG. 15 illustrates the inductor 1400 of FIG. 14 with inner and outer circumferences shown. Specifically, FIG. 15 illustrates the inner circumference 1500 and the outer circumference 1502 of the inductor 1400. As show in FIG. 15, the inductor 1400 has an inner circumference 1500 and an outer circumference 1502. In some implementations, the set of windings 1402 has the inner circumference 1500 and the outer circumference 1502. The inner circumference 1502 has an inner radius. As further shown in FIG. 15, none of the components of the inductor 1400 are located within the inner circumference 1500. That is, all of the components of the inductor 1400 are on or outside the inner circumference 1500.

In some implementations, the first pad 1404, the second pad 1406, and the third pad 1408 are outside the inner circumference 1500 in order to reduce/minimize eddy current loss. In some implementations, reducing/minimizing the eddy current loss can result in an increase in the quality factor (Q) of the set of windings 1402 and/or inductor 1400.

FIG. 15 also illustrates that the first pad 1404, the second pad 1406, and the third pad 1408 protrude away from the inner circumference 1500 and the outer circumference 1502. In particular, as shown in FIG. 15, in some implementations, at least a portion (e.g., some or all) of the first pad 1404 is outside the outer circumference 1502 of the set of windings 1402. Similarly, in some implementations, at least a portion (e.g., some or all) of the second pad 1406 is outside the outer circumference 1502 of the set of windings 1402. Moreover, in some implementations, at least a portion (e.g., some or all) of the third pad 1408 is outside the outer circumference 1502 of the set of windings 1402. In some implementations, at least a portion of the first pad 1404, at least a portion of the second pad 1406, and at least a portion of the third pad 1408 are outside the outer circumference 1502 in order to reduce/minimize eddy current loss. In some implementations, reducing/minimizing the eddy current loss can result in an increase in the quality factor (Q) of the set of windings 1402 and/or inductor 1400.

In some implementations, the inductor 1400 of FIGS. 14-15 may have a similar and/or identical structure and/or profile as the inductors shown and described in FIGS. 9-13.

In some implementations, for purposes of defining and/or determining the perimeter (e.g., inner perimeter, outer perimeter, inner circumference, outer circumference) of the set of windings, the position and/or dimension of the set pads that are coupled to the set of windings shall not be considered or taken into account (i.e., the set of pads shall be excluded when defining and/or determining the perimeter (e.g., inner perimeter, outer perimeter, inner circumference, outer circumference) of the set of windings). Similarly, in some implementations, for purposes of defining and/or determining the perimeter (e.g., inner perimeter, outer perimeter, inner circumference, outer circumference) of the set of windings, the position and/or dimension of the set vias that are coupled to the set of windings shall not be considered or taken into account (i.e., the set of vias shall be excluded when defining and/or determining the perimeter of the set of windings). For example, in some implementations, only the set of interconnects shall be taken into account when defining and/or determining the perimeter (e.g., inner perimeter, outer perimeter, inner circumference, outer circumference) of the set of windings.

Having provided several exemplary inductors (e.g., solenoid inductors) a sequence for providing/manufacturing a substrate that includes an inductor will now be described below.

Exemplary Processes for Manufacturing Substrate that Includes a Solenoid Inductor FIGS. 16A-16D illustrate an exemplary sequence for providing/manufacturing a substrate that includes an inductor (e.g., solenoid inductor). It should be noted that for the purpose of clarity and simplification, the processes of FIGS. 16A-16D do not necessarily include all the steps and/or stages of manufacturing a substrate. Moreover, in some instances, several steps and/or stages may have been combined into a single step and/or stage in order to simplify the description of the processes. It should also be noted that the shapes of the patterns, pattern features, components (e.g., composite conductive trace, vias) in FIGS. 16A-16D are merely conceptual illustrations and are not intended to necessarily represent the actual shape and form of the patterns, pattern features and components.

Figure 16A:
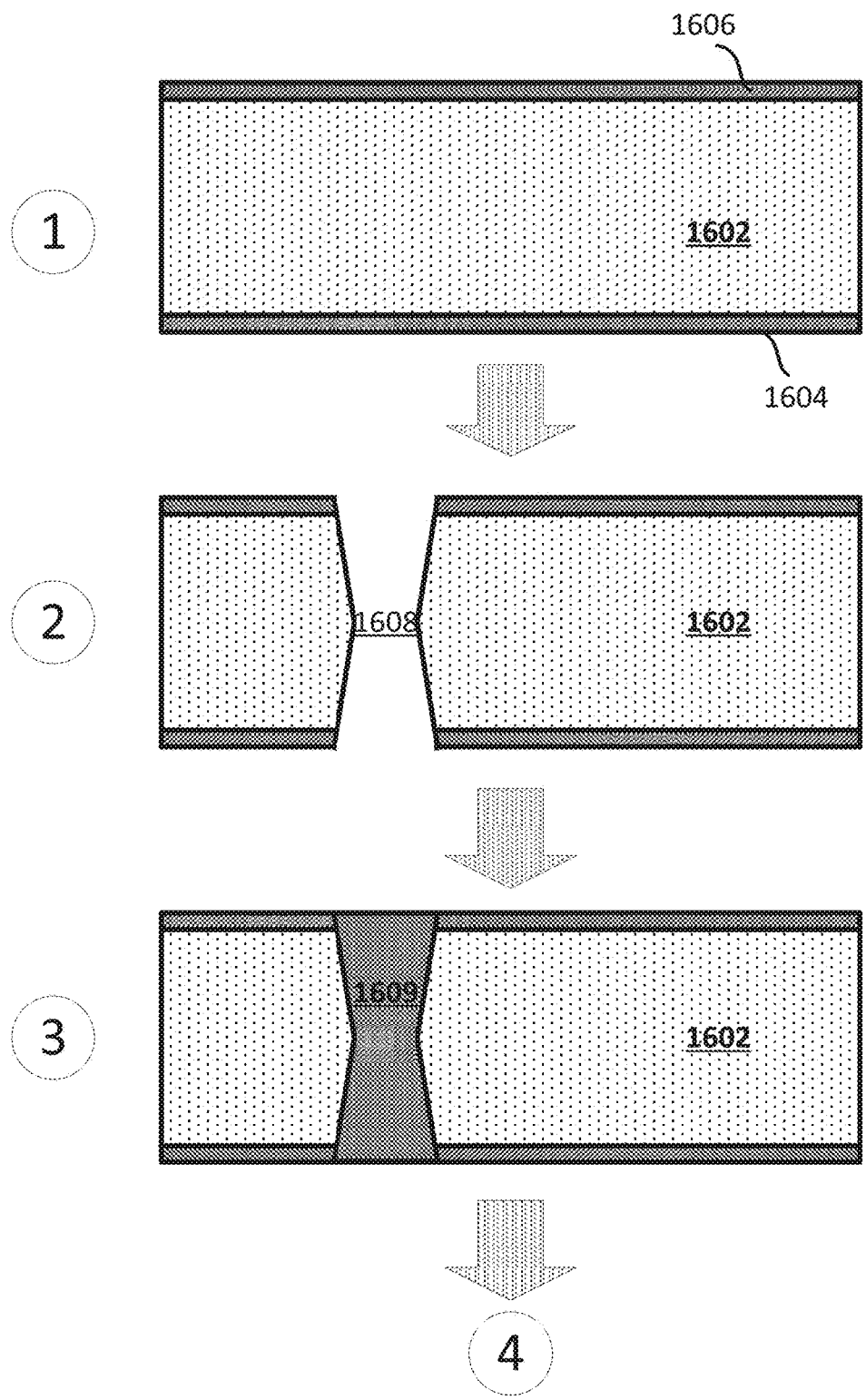
FIGS. 16A-16D illustrate a shortened sequence of a plating process for manufacturing a substrate with low coefficient of thermal expansion copper composite materials.
Figure 16B:
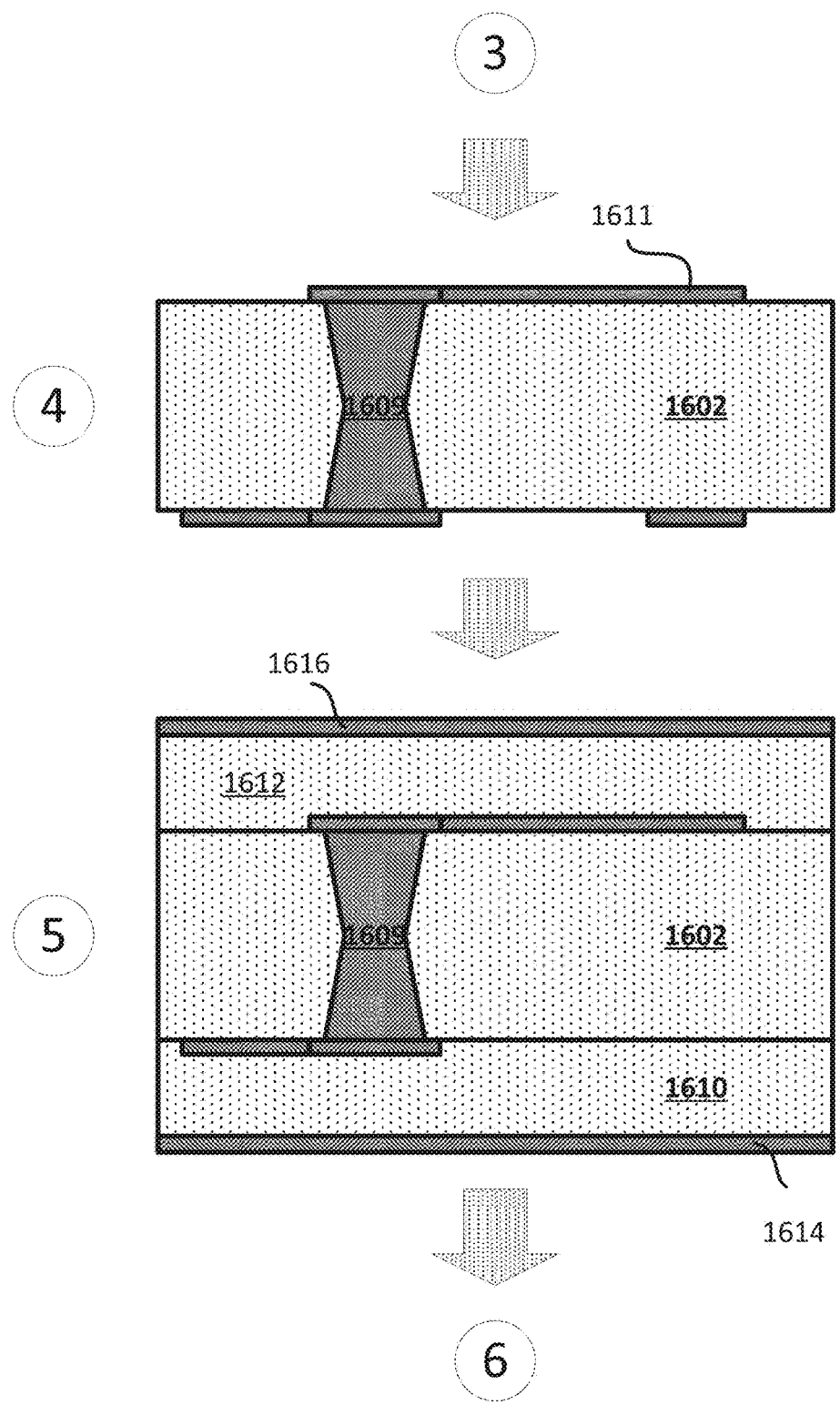
Figure 16C:
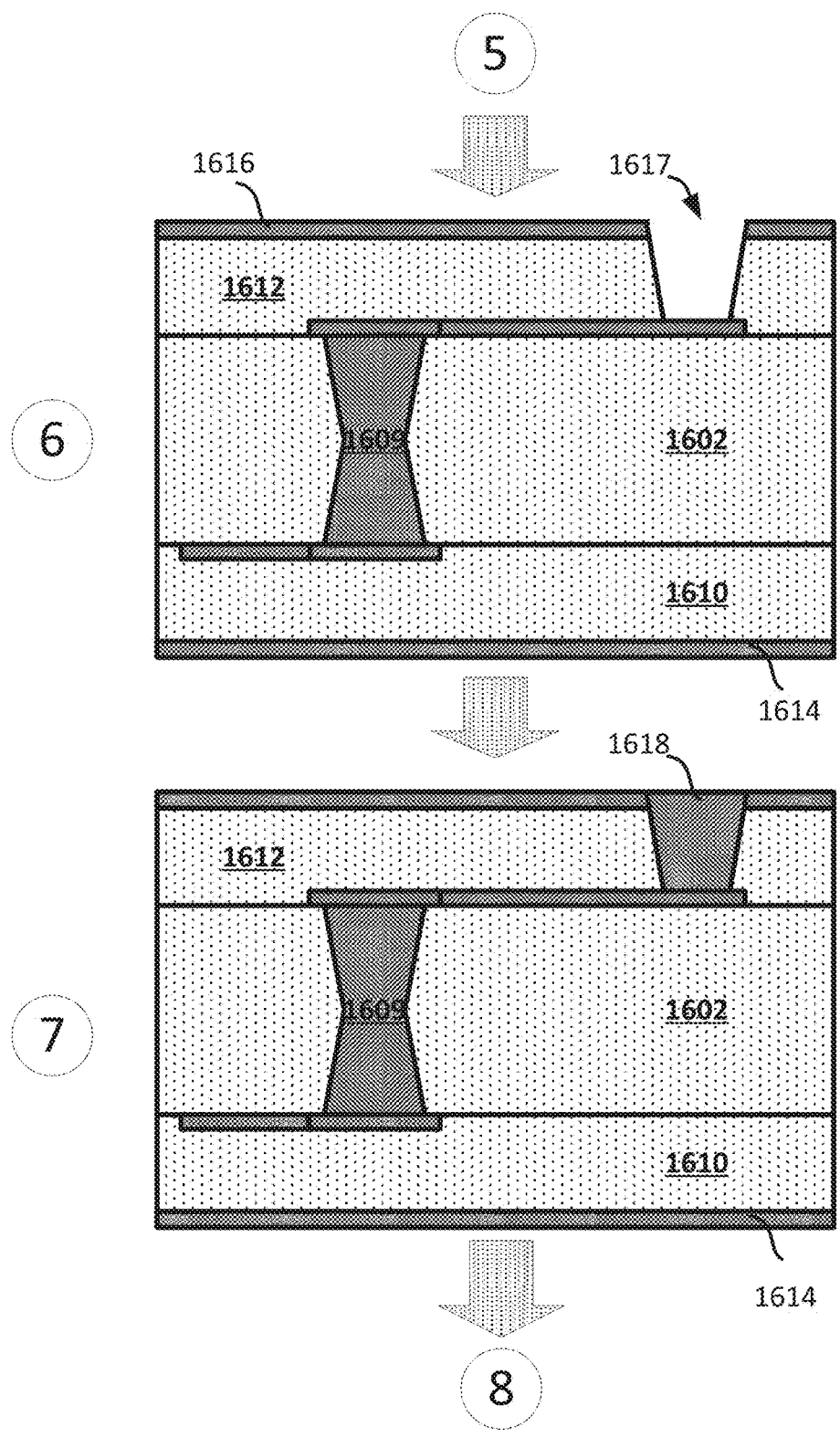
Figure 16D:
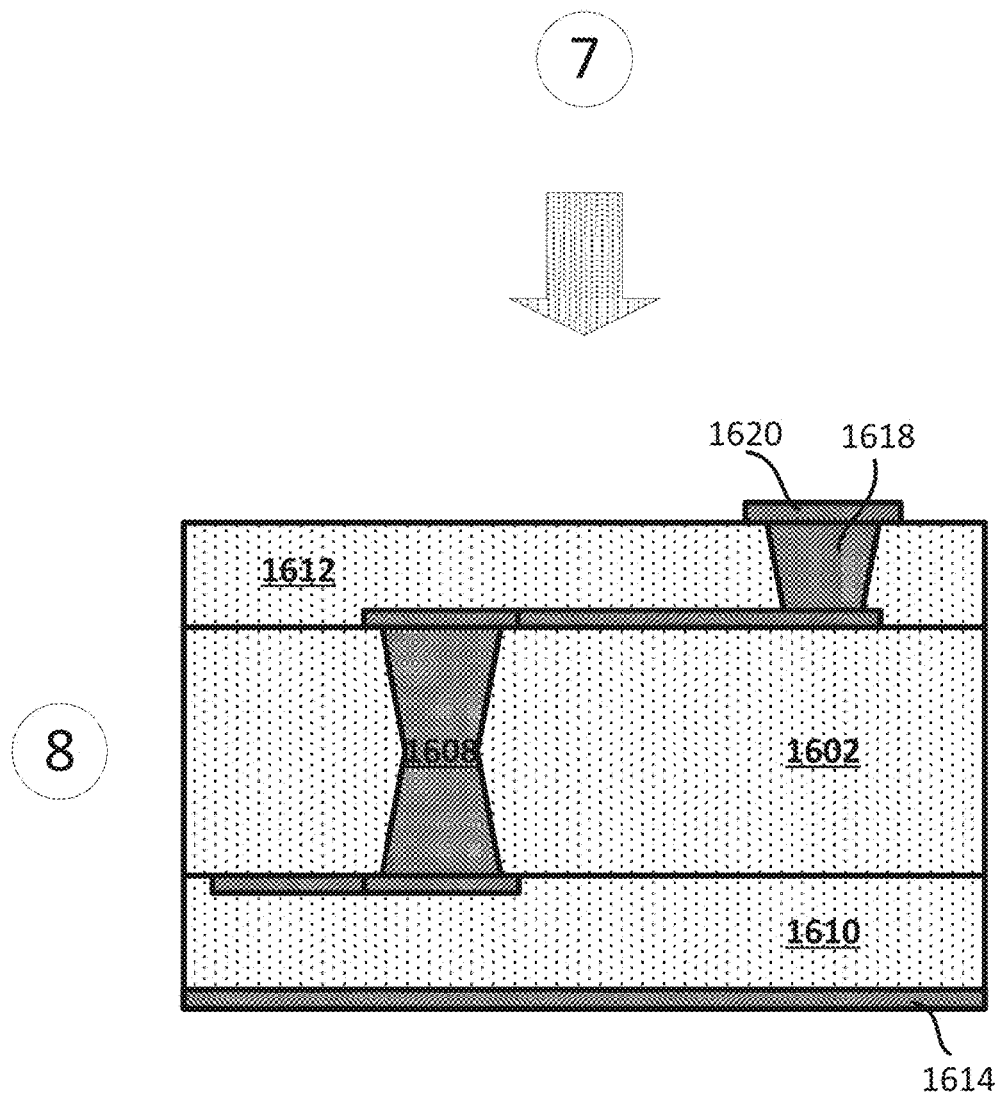

As shown in FIG. 16A, the plating process begins (at stage 1) with a core layer 1602. The core layer 1602 is a dielectric in some implementations. Often a material manufacturer or a material supplier may, may supply the core layer 1602 with a first metal layer 1604 and a second metal layer 1606 to a substrate manufacturer. Different implementations may use different metal layers 1604-1606. In some implementations, one or both of the metal layers 1604-1606 is a copper material (e.g., copper composite foil). In some implementations, one or more of the metal layers (e.g., copper composite foil) may have a thickness of 2-5 microns (μm). In some implementations, one or more metal layers 1604-1606 may be a copper composite foil that has a thickness of 3-12 microns (μm). In such instances, the process may optionally etch down the thickness of the low copper composite foil. In some implementations, one or more of the metal layers 1604-1606 may be a copper layer with a primer.

Next, the process performs (at stage 2) a drilling operation on the core layer 1602, which defines one or more pattern features (e.g., via pattern feature 1608) on the substrate. The drilling operation may be a laser drilling operation. The drilling operation may traverse through the first metal layer 1604, dielectric of the core layer 1602, and the second metal layer 1606.

The process then performs (at stage 3) one or more plating processes, which defines the features (e.g., via feature 1609) of the substrate. In some implementations, the via feature 1609 may provide an interconnection between the front and the back of the substrate. Different implementations may perform the plating process differently. In some implementations, an electroless copper seed is deposited on (e.g., the surface of) the pattern features (e.g., via pattern feature 1608), which forms the via feature 1609. Stage 3 of FIG. 16A illustrates that only the surface of the pattern feature 1608 is covered, which means a layer of the electroless copper seed is formed on the wall of the feature 1609. Some implementations may perform fill plating to define the features/components of the substrate. In some implementations, the fill plating may be formed on one or more of the metal layers 1604-1606. That is, at stage 3, some implementations, may add an additional layer (e.g., copper, copper composite) on the metal layers 1604-1606. In some implementations, the core layer 1602 may be received without any metal layers 1604-1606 from material suppliers. In such instances, at stage 3, the process may add/deposit/plate one or more metal layers on the core layer 1602. The various processes/methods for adding, depositing, or plating copper and/or a copper composite will be further described in detail with respect to FIGS. 17-21.

Next, the process provides (at stage 4) one or more features/components (e.g., composite conductive traces 1611) for the core layer 1602. In some implementations, the features may be defined from the metal layers 1604-1606. Different implementations may define the features differently. In some implementations, the process provides the features (e.g., composite conductive traces 1611) by using a dry film patterning process, a dry film stripping process, and an etching process. Several dry film patterning, dry film stripping, and etching processes will further be described below with respect to FIGS. 17-21. Stage 4 conceptually represents the end result of using of these dry film patterning, dry film stripping and etching processes in some implementations. Examples of these processes include a modified semi additive process (mSAP) and a subtractive etching process.

The process then provides (at stage 5) a first prepreg layer 1610 and a second prepreg layer 1612. The prepreg layers 1610 and 1612 are a dielectric in some implementations. Often a substrate manufacturer or substrate supplier, may supply the prepreg layers 1610 and 1612 with a third metal layer 1614 and a fourth metal layer 1616. Different implementations may use different metal layers 1614-1616. In some implementations, one or both of the metal layers 1614-1616 is a copper material (e.g., copper composite foil). In some implementations, one or more of the metal layers (e.g., copper composite foil) may have a thickness of 2-5 microns (μm). In some implementations, one or more metal layers 1614-1616 may be a copper composite foil that has a thickness of 3-12 microns (μm). In such instances, the process may optionally etch down the thickness of the copper composite foil. In some implementations, one or more of the metal layers 1614-1616 may be a copper layer with a primer.

Next, the process performs (at stage 6) a drilling operation on the second prepreg layer 1612, which defines one or more pattern features (e.g., via pattern feature 1617) on the prepreg layer 1612. The drilling operation may be a laser drilling operation. The process then performs (at stage 7) one or more plating processes, which defines the features (e.g., via feature 1618) of the substrate. Different implementations may perform the plating process differently. In some implementations, an electroless copper composite seed is deposited on (e.g., the surface of) the pattern features (e.g., via pattern feature 1617), which forms the via feature 1618. Stage 7 illustrates that in some implementations, only the surface of the pattern feature 1617 is covered, which means a layer of the electroless copper composite seed is formed on the wall of the feature 1617. Some implementations may perform fill plating to define the features/components of the substrate. In some implementations, the fill plating and/or the electroless copper seed may be formed on one or more of the metal layers 1614-1616. That is, at stage 7, some implementations, may add an additional layer (e.g., copper, copper composite) on the metal layers 1614-1616. In some implementations, the layers 1610 and 1612 may be received without any metal layers 1614-1616 from substrate suppliers. Such layers 1610 and 1612 may be referred to as a buildup layer (e.g., layer when there is no copper foil). In such instances, at stage 7, the method may add/deposit/plate one or more metal layers (e.g., copper seed layer) on the prepreg layers 1610 and 1612. The various processes/methods for adding, depositing, or plating copper and/or a copper composite will be further described in detail with respect to FIGS. 17-21.

Next, the process provides (at stage 8) one or more features/components (e.g., composite conductive trace 1620) for the prepreg layer 1612. In some implementations, the features may be defined from the metal layer 1616. Different implementations may define the features differently. In some implementations, the process provides/defines the features (e.g., composite conductive trace 1620) by using a dry film patterning process, a dry film stripping process, and an etching process. Several dry film patterning, dry film stripping, and etching processes will further be described below with respect to FIGS. 17-21. Stage 8 conceptually represents the end result of using of these dry film patterning, dry film stripping and etching processes in some implementations. Examples of these processes include a modified semi additive process (mSAP) and a subtractive etching process.

While the example illustrated in FIGS. 16A-16D are for an mSAP process, a SAP process would follow a similar process except that the copper foil would be completely removed at the beginning of the process in some implementations.

In some implementations, additional layers may be added to the substrate. As such, the plating process may be repeated several times (e.g., stages 5-8 may be repeated) until a desired number of layers is reached.

Having described a shortened sequence for a paste process and a plating process, a more detailed description of the above processes will now be described below.

Exemplary Flow Diagram for Plating Process

Figure 17:
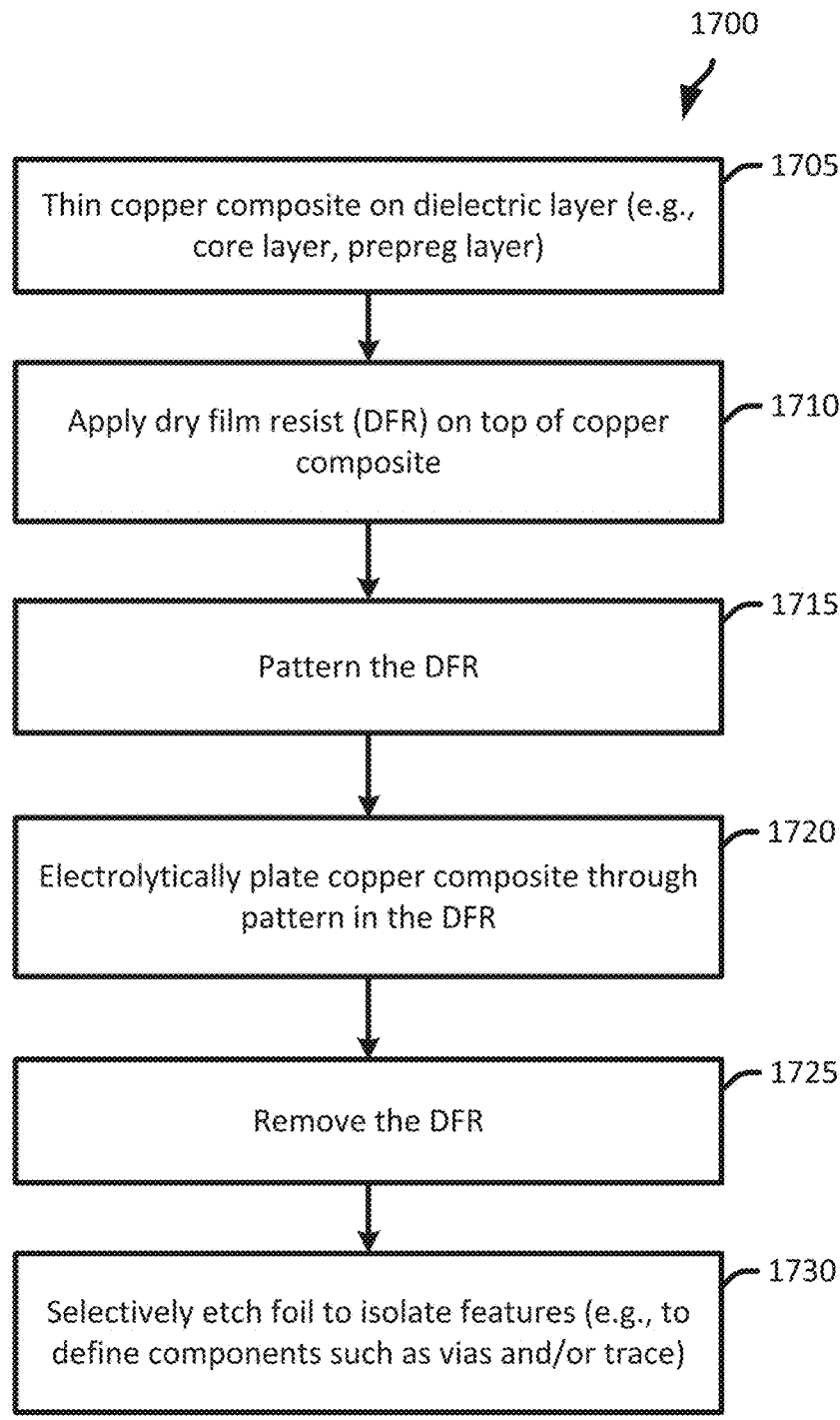
FIG. 17 illustrates a flow diagram of a modified semi-additive processing (mSAP) patterning process for manufacturing a substrate with low coefficient of thermal expansion copper composite materials.

FIG. 17 illustrates a flow diagram for a modified semi-additive processing (mSAP) patterning process for manufacturing a substrate that includes a solenoid inductor. FIG. 17 will be described with reference to FIG. 18 which illustrates a sequence of a layer (e.g., core layer, prepreg layer) of a substrate during the mSAP process of some implementations.

As shown in FIG. 17, the process 1700 may start by thinning (at 1705) a metal layer (e.g., copper composite material) on a dielectric layer. The dielectric layer may be a core layer or a prepreg layer of the substrate. In some implementations, the metal layer is thinned to a thickness of 3-5 microns (μm). The thinning of the metal layer is illustrated in stage 1 of FIG. 18, which illustrates a dielectric layer 1802 that includes a thin copper layer 1804 (which may be a copper composite material). In some implementations, the metal layer may already be thin enough. For example, in some implementations, the core layer or dielectric layer may be provided with a thin copper foil. As such, some implementations may bypass/skip thinning the metal layer of the core layer/dielectric layer. In addition, in some implementations electroless copper seed layer plating may performed to cover the surface of any drilled vias in one or more dielectric layers.

Figure 18:
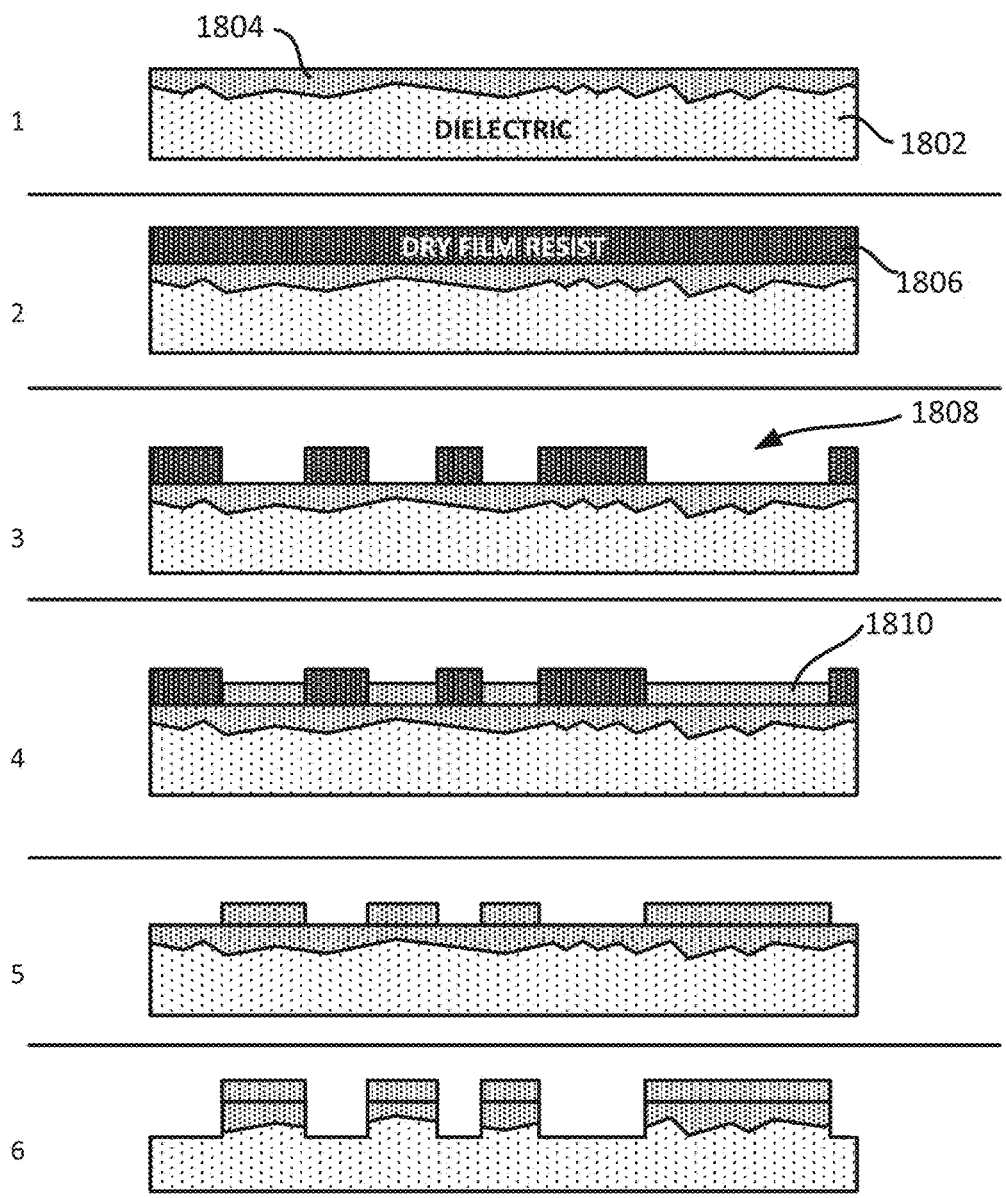
FIG. 18 illustrates a sequence of a mSAP patterning process on a layer of a substrate.

Next, the process applies (at 1710) a dry film resist (DFR) and a pattern is created (at 1710) on the DFR. Stage 2 of FIG. 18 illustrates a DFR 1806 being applied on top of the thinned metal layer 1804, while stage 3 of FIG. 18 illustrates the patterning of the DFR 1806. As shown in stage 3, the patterning creates openings 1808 in the DFR 1806.

After patterning (at 1715) the DFR, the process then electrolytically plates (at 1720) a copper composite material through the pattern of the DFR. In some implementations, electrolytically plating comprises dipping the dielectric and the metal layer in a bath solution. Referring to FIG. 18, stage 4 illustrates copper composite materials 1810 being plated in the openings 1808 of the DFR 1806.

Referring back to FIG. 17, the process removes (at 1725) the DFR, selectively etches (at 1730) the copper composite foil material to isolate the features (e.g., create components such vias, composite conductive traces, and/or pads) and ends. Referring to FIG. 18, stage 17 illustrates the removal of the DFR 1806, while stage 6 illustrates the defined features after the etching process. The above process of FIG. 11 may be repeated for each core layer or prepreg layer (dielectric layer) of the substrate. Having described one plating process, another plating process will now be described.

Figure 19:
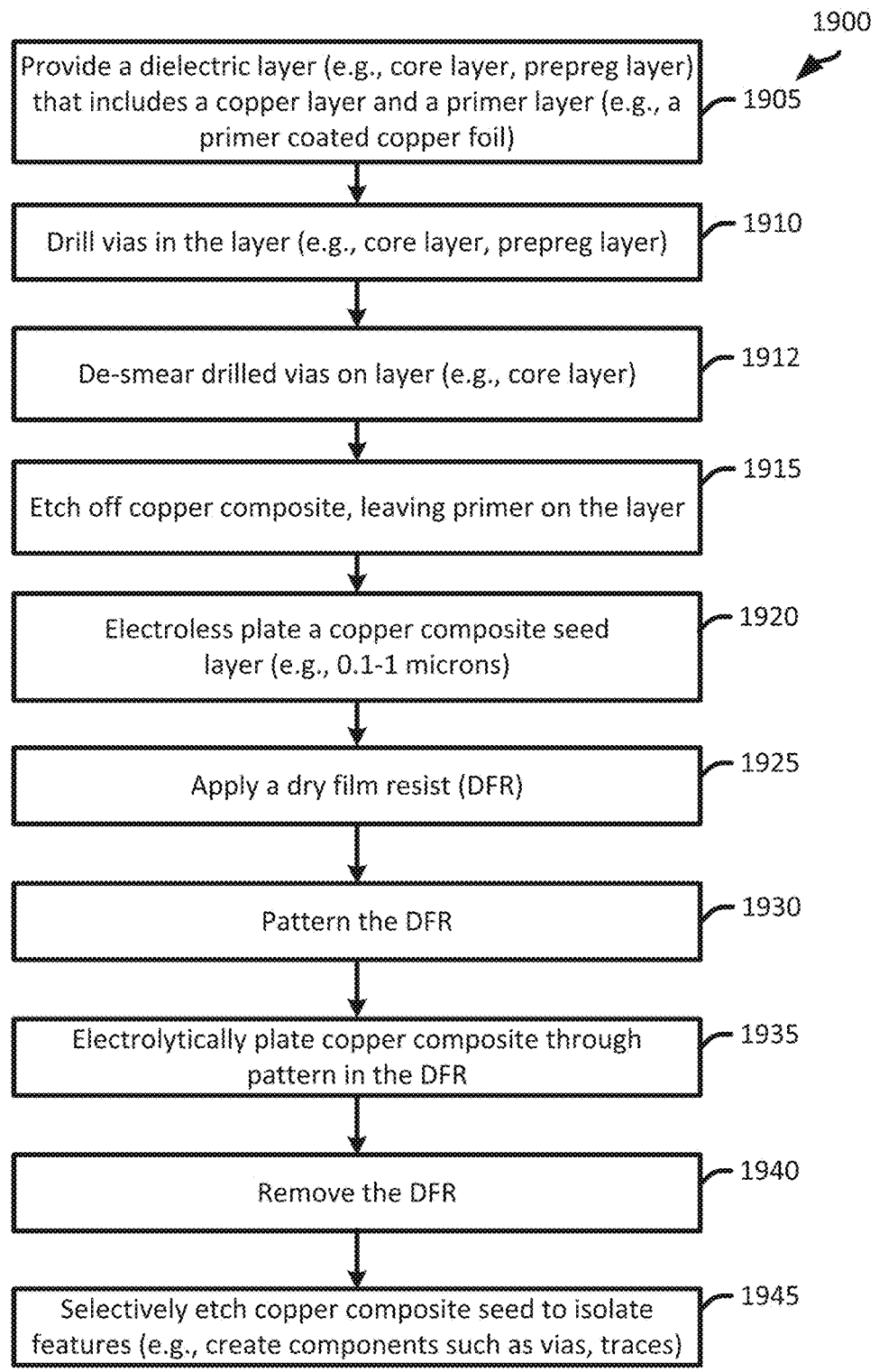
FIG. 19 illustrates a flow diagram of a semi-additive processing (SAP) patterning process for manufacturing a substrate with low coefficient of thermal expansion copper composite materials.

FIG. 19 illustrates a flow diagram for a semi-additive processing (SAP) patterning process for manufacturing a substrate that includes a solenoid inductor. FIG. 19 will be described with reference to FIG. 20 which illustrates a sequence of a layer (e.g., core layer, prepreg layer) of a substrate during the SAP process of some implementations.

As shown in FIG. 19, the process 1900 may start by providing (at 1905) a dielectric layer that includes copper layer and a primer layer (e.g., a primer coated copper foil). In some implementations, the copper foil is coated with primer and then pressed on the uncured core to form the structure. The primer coated copper foil may be a copper foil. The dielectric layer may be a core layer or a prepreg layer of a substrate. As shown in stage 1 of FIG. 20, the primer 2004 is located between the copper foil 2006 and the dielectric 2002. The copper foil 2006 may be a copper composite foil in some implementations.

Next, the process drills (at 1910) the dielectric layer (e.g., core layer, prepreg layer) to create one or more openings/pattern features (e.g., via pattern features). This may be done to form one or more vias/via features that connect the front and back side of the dielectric. In some implementations, the drilling may be performed by a laser drilling operation. Moreover, in some implementations, the drilling may traverse one or more the metal layers (e.g., primer coated copper foil). In some implementations, the process may also clean the openings/pattern features (e.g., via patterns) created by the drilling operation, by, for example, de-smearing (at 1912) drilled vias/opening on the layer (e.g., core layer).

Figure 20:
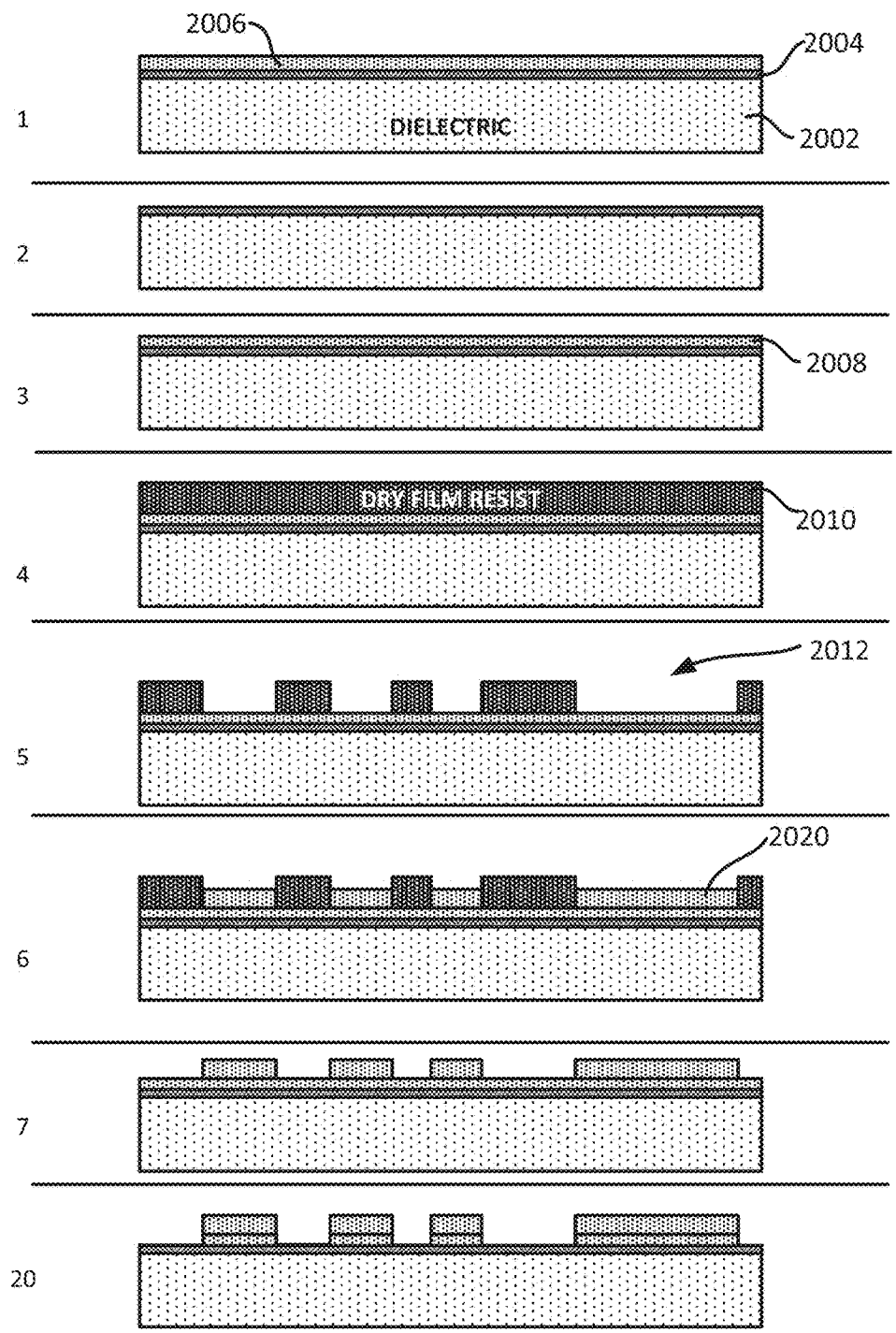
FIG. 20 illustrates a sequence of a SAP patterning process on a layer of a substrate.

The process then etches off (at 1915) the copper foil, leaving the primer on the dielectric layer (which is shown in stage 2 of FIG. 20). Next, the process electroless plates (at 1920) a copper seed layer (e.g., copper material) on the primer in some implementations. The thickness of the copper seed layer in some implementations is about 0.1-1 microns (μm). Stage 3 of FIG. 20 illustrates a copper seed layer 2008 on the primer 2004.

Next, the process applies (at 1925) a dry film resist (DFR) and a pattern is created (at 1930) on the DFR. Stage 4 of FIG. 20 illustrates a DFR 2010 being applied on top of the copper seed layer 2008, while stage 5 of FIG. 20 illustrates the patterning of the DFR 2010. As shown in stage 5, the patterning creates openings 2012 in the DFR 2010.

After patterning (at 1930) the DFR, the process then electrolytically plates (at 1935) a copper material (e.g., copper composite material) through the pattern of the DFR. In some implementations, electrolytically plating comprises dipping the dielectric and the metal layer in a bath solution. Referring to FIG. 20, stage 6 illustrates copper composite materials 2014 being plated in the openings 2012 of the DFR 2010.

Referring back to FIG. 19, the process removes (at 1940) the DFR, selectively etches (at 1945) the copper seed layer to isolate the features (e.g., create vias, traces, pads) and ends. Referring to FIG. 20, Stage 7 illustrates the removal of the DFR 2010, while Stage 8 illustrates the defined features (e.g., composite conductive trace) after the etching process.

The above process of FIG. 19 may be repeated for each core layer or prepreg layer (dielectric layer) of the substrate.

In some implementations, the SAP process may allow for finer/smaller feature (e.g., trace, vias, pads) formation since the SAP process does not require as much etching to isolate features.

Figure 21:
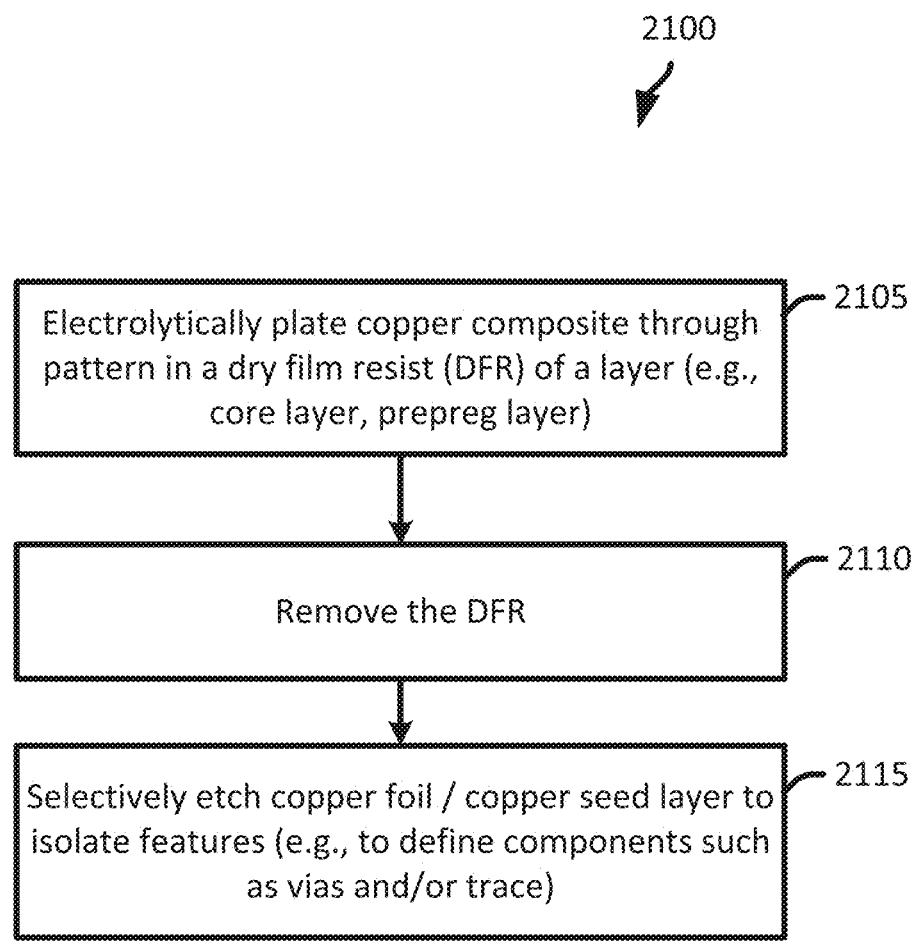
FIG. 21 illustrates a flow diagram of a conceptual plating process.

The plating processes of FIGS. 17 and 19 may be conceptually simplified to the plating process of FIG. 21 in some implementations. FIG. 21 illustrates a flow diagram for a plating method for manufacturing a substrate that includes a novel solenoid inductor. As shown in FIG. 21, the method electrolytically plates (at 2105) a copper composite through a pattern in a dry film resist (DFR) on a layer of a substrate. The layer may be a dielectric layer. The layer may be a core layer or a prepreg layer of the substrate. In some implementations, the copper composite is plated over a copper seed layer, which was previously deposited on the layer (e.g., when using a SAP process). In some implementations, the copper composite is plated over a copper foil layer, which was previously on the layer (e.g., when using an mSAP process). The copper foil layer may be a copper composite material in some implementations.

Next, the method removes (at 2110) the DFR from the layer. In some implementations, removing the DFR may include chemically removing the DFR. After removing (at 2110) the DFR, the method selectively etches (at 2115) the foil or seed layer to isolate/define the features of the layer and ends. As described above, the foil may be a copper composite material.

In some implementations, a nickel alloy may be added (e.g., plated) over some or all of a copper layer (e.g., copper foil) during an mSAP process (e.g., methods of FIGS. 17, 18, and 19). Similarly, a nickel alloy may also be added (e.g., plated) over some or all of a copper layer (e.g., copper foil) during a subtractive process.

Exemplary Flow Diagram for Providing a Substrate that Includes an Inductor

Figure 22:
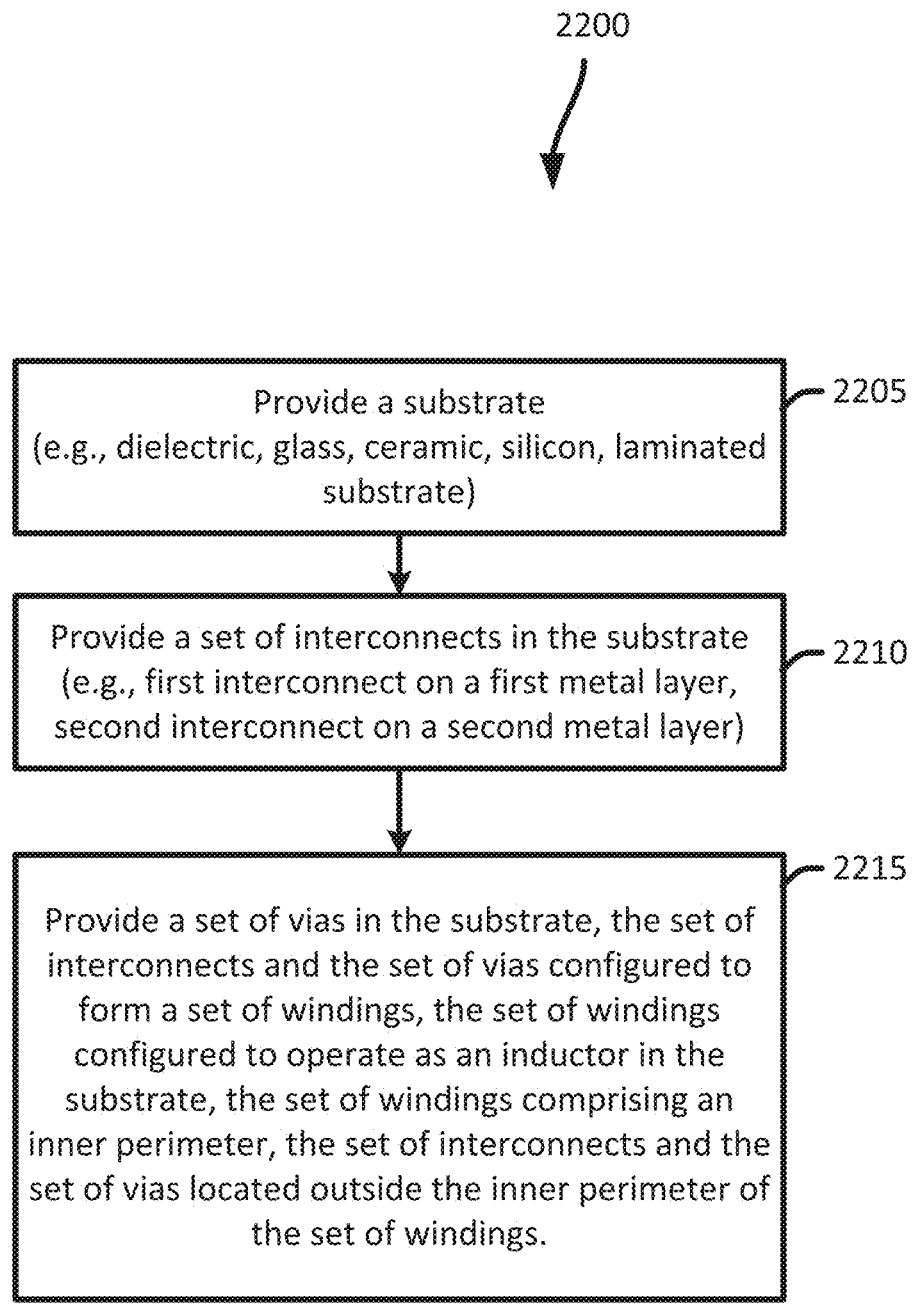
FIG. 22 illustrates a flow diagram of a method for providing a substrate that includes a solenoid inductor.

FIG. 22 illustrates an exemplary flow diagram for a method for providing a substrate that includes a novel solenoid inductor. In some implementations, the method of FIG. 22 may be used to provide the inductor of FIGS. 2, 3, 4, 5, 6, 7, 8, 9, 10, 11, 12, 13, 14, and/or 15.

As shown in FIG. 22, the method provides (at 2205) a substrate. Different implementations may provide different substrates. In some implementations, the substrate is a laminated substrate (e.g., substrate that includes several dielectric layers). In some implementations, the substrate is a glass substrate. In some implementations, the substrate is a silicon substrate. In some implementations, the substrate is ceramic substrate. In some implementations, providing the substrate may include manufacturing the substrate.

The method then provides (at 2210) a set of interconnects in the substrate. The set of interconnects may include a first set of interconnect and a second set of interconnects. In some implementations, providing (at 2210) the set of interconnects define a set of windings for an inductor (e.g., solenoid inductor) in the substrate. In some implementations, providing (at 2210) the set of interconnects includes a plating process that deposits one or more metal layers (e.g., copper layer) in the substrate.

The method further provides (at 2215) a set of vias in the substrate. The set of interconnects and the set of vias are provided so that they are configured to form a set of windings. The set of windings is configured to operate as an inductor (e.g., solenoid inductor) in the substrate. The set of windings includes an inner perimeter (e.g., inner circumference). The set of interconnects and the set of vias are located outside the inner perimeter of the set of windings. In some implementations, providing the set of vias includes a plating process that deposits one or more metal layers (e.g., copper layer) in the substrate.

In some implementations, the method also provides a set of pads in the substrate. The set of pads may be provided concurrently (e.g., provided at 2210) with the set of interconnects in some implementations. The set of interconnects is coupled to the set of vias through the set of pads. In some implementations, the set of windings includes an outer perimeter (e.g., outer circumference). In some implementations, the set of pads is coupled to the set of interconnects such that the set of pads is at least partially outside the outer perimeter of the set of windings. In some implementations, the set of pads is coupled to the set of interconnects such that the set of pads protrudes away from an inner portion of the inductor and the set of windings (e.g., away from an outer perimeter of the set of windings).

Exemplary Electronic Devices

Figure 23:
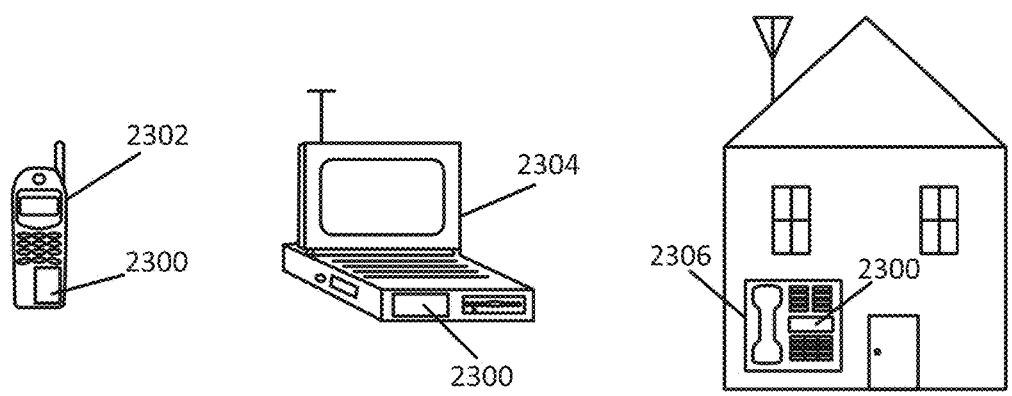
FIG. 23 illustrates various electronic devices that may integrate an integrated device, substrate, and/or PCB described herein.

FIG. 23 illustrates various electronic devices that may be integrated with any of the aforementioned integrated device (e.g., semiconductor device), integrated circuit, die, interposer and/or package. For example, a mobile telephone 2302, a laptop computer 2304, and a fixed location terminal 2306 may include an integrated circuit (IC) 2300 as described herein. The IC 2300 may be, for example, any of the integrated devices, integrated circuits, dice or packages described herein. The devices 2302, 2304, 2306 illustrated in FIG. 23 are merely exemplary. Other electronic devices may also feature the IC 2300 including, but not limited to, mobile devices, hand-held personal communication systems (PCS) units, portable data units such as personal digital assistants, GPS enabled devices, navigation devices, set top boxes, music players, video players, entertainment units, fixed location data units such as meter reading equipment, communications devices, smartphones, tablet computers or any other device that stores or retrieves data or computer instructions, or any combination thereof.

One or more of the components, steps, features, and/or functions illustrated in FIGS. 2, 3, 4, 5, 6, 7, 8, 9, 10, 11, 12, 13, 14, 15, 16A-16D, 17, 18, 19, 20, 21, 22 and/or 23 may be rearranged and/or combined into a single component, step, feature or function or embodied in several components, steps, or functions. Additional elements, components, steps, and/or functions may also be added without departing from the invention.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

It should also be noted the inductors described in the present disclosure may be implemented in other portions of a device. For example, in some implementations, the inductors described in the present disclosure may be implemented (e.g., manufactured, provided) in a printed circuit board (PCB) and/or a die (e.g., in lower metal layers and dielectric layers of a die), using known manufacturing processes.

The various features of the invention described herein can be implemented in different systems without departing from the invention. It should be noted that the foregoing aspects of the disclosure are merely examples and are not to be construed as limiting the invention. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. An integrated device comprising:
    a substrate having multiple layers; and
    an inductor, formed in the multiple layers of the substrate, comprising a set of interconnects coupled in series with a set of pads and a set of vias to form a set of windings, an inner perimeter of each winding in the set of windings having an inner radius that is common to each winding in the set of windings,
    wherein the set of interconnects, the set of pads, and the set of vias are located only outside of the inner perimeter of each winding and at least a portion of each pad in the set of pads is located outside of an outer perimeter of each winding, wherein a length of each interconnect is less than a circumference of a winding.

2. The integrated device of claim 1, wherein the set of interconnects is coupled to the set of vias through the set of pads.

3. The integrated device of claim 2, wherein the set of interconnects includes a first interconnect and a second interconnect, the set of vias includes a first via and a second via, and the set of pads includes a first pad and a second pad.

4. The integrated device of claim 3, wherein the first interconnect is coupled to the first via through the first pad, the first via is coupled to the second interconnect through the second pad.

5. The integrated device of claim 1, wherein the inductor is a solenoid inductor.

6. The integrated device of claim 1, wherein the substrate comprises at least one of a dielectric, glass, ceramic, and silicon.

7. The integrated device of claim 1, wherein the set of windings has a non-circular winding.

8. The integrated device of claim 1, wherein the integrated device is incorporated into at least one of a music player, a video player, an entertainment unit, a navigation device, a communications device, a mobile device, a mobile phone, a smartphone, a personal digital assistant, a fixed location terminal, a tablet computer, and a laptop computer.

9. The integrated device of claim 1, wherein a width of each interconnect in the set of interconnects is less than a width of each pad in the set of pads.

10. An apparatus comprising:
a substrate having multiple layers; and
an inductive means, formed in the multiple layers of the substrate, comprising a set of winding means for providing an electrical lateral path along a lateral direction in the substrate, and a set of via and pad means for coupling a plurality of the winding means in series and for providing an electrical vertical path along a vertical direction in the substrate, the set of winding means and the set of via and pad means forming a set of windings, an inner perimeter of each winding in the set of windings having an inner radius that is common to each winding in the set of windings,
wherein the set of winding means and set of via and pad means are located only outside of the inner perimeter of each winding and at least a portion of each pad in the set of via and pad means is located outside of an outer perimeter of each winding.

11. The apparatus of claim 10, wherein the via and pad means protrudes away from an inner portion of the inductive means and the winding means.

12. The apparatus of claim 10, wherein the winding means includes a first interconnect and a second interconnect, the via and pad means includes a first via, a second via, a first pad, and a second pad.

13. The apparatus of claim 10, wherein the substrate comprises at least one of a dielectric, glass, ceramic, and silicon.

14. The apparatus of claim 10, wherein the set of windings has a non-circular winding.

15. The apparatus of claim 10, wherein the apparatus is incorporated into at least one of a music player, a video player, an entertainment unit, a navigation device, a communications device, a mobile device, a mobile phone, a smartphone, a personal digital assistant, a fixed location terminal, a tablet computer, and a laptop computer.

16. The apparatus of claim 10, wherein a width of each interconnect in the set of interconnects is less than a width of each pad in the set of via and pad means.

17. A method for providing an integrated device, comprising:
providing a substrate having multiple layers;
providing a set of interconnects formed in the multiple layers of the substrate;
providing a set of vias in the substrate to couple to the set of interconnects;
providing a set of pads in the substrate to couple the set of interconnects to the set of vias through the set of pads in series to form a set of windings configured to operate as an inductor, an inner perimeter of each winding in the set of windings having an inner radius that is common to each winding in the set of windings; and
locating the set of interconnects, the set of pads, and the set of vias only outside of the inner perimeter of each winding and locating at least a portion of each pad in the set of pads outside of an outer perimeter of each winding.

18. The method of claim 17, wherein the set of pads is coupled to the set of interconnects such that the set of pads protrudes away from an inner portion of the inductor and the set of windings.

19. The method of claim 17, wherein the set of interconnects includes a first interconnect and a second interconnect, the set of vias includes a first via and a second via, and the set of pads includes a first pad and a second pad.

20. The method of claim 19, wherein the first interconnect is coupled to the first via through the first pad, the first via is coupled to the second interconnect through the second pad.

21. The method of claim 17, wherein the substrate comprises at least one of a dielectric, glass, ceramic, and silicon.

22. The method of claim 17, wherein the set of windings has a non-circular winding.

23. The method of claim 17, wherein the integrated device is incorporated into at least one of a music player, a video player, an entertainment unit, a navigation device, a communications device, a mobile device, a mobile phone, a smartphone, a personal digital assistant, a fixed location terminal, a tablet computer, and a laptop computer.

24. The method for providing the integrated device of claim 17, wherein a width of each interconnect provided in the set of interconnects is less than a width of each pad provided in the set of pads.

* * * * *